(12) United States Patent  
Kim et al.

(10) Patent No.: US 11,092,623 B2  
(45) Date of Patent: Aug. 17, 2021

(54) CURRENT SENSOR FOR MEASURING ALTERNATING ELECTROMAGNETIC WAVE AND A CURRENT BREAKER USING THE SAME

(71) Applicant: ELECTRONICS AND TELECOMMUNICATIONS RESEARCH INSTITUTE, Daejeon (KR)

(72) Inventors: Hyun-Tak Kim, Daejeon (KR); Bit Na Kim, Daejeon (KR); Sungwoo Jo, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/709,216

(22) Filed: Dec. 10, 2019

(65) Prior Publication Data

US 2020/0182913 A1 Jun. 11, 2020

(30) Foreign Application Priority Data

Dec. 11, 2018 (KR) .................. 10-2018-0159111
Sep. 26, 2019 (KR) .................. 10-2019-0118732

(51) Int. Cl.
*G01R 19/00* (2006.01)
*G01R 19/28* (2006.01)
*G01R 15/18* (2006.01)

(52) U.S. Cl.
CPC ......... *G01R 19/0092* (2013.01); *G01R 15/18* (2013.01); *G01R 19/0053* (2013.01); *G01R 19/28* (2013.01)

(58) Field of Classification Search
None
See application file for complete search history.

(56) References Cited

U.S. PATENT DOCUMENTS

| | | |
|---|---|---|
| 5,717,326 A | 2/1998 | Moriwaki |
| 8,160,829 B2 | 4/2012 | Kalenine |
| 8,305,566 B2 | 11/2012 | Xiao et al. |
| 9,310,398 B2 | 4/2016 | Ausserlechner |
| 9,322,806 B2 | 4/2016 | Bureau |
| 9,958,480 B2 | 5/2018 | Nejatali et al. |
| 10,082,527 B2 | 9/2018 | Polley et al. |

(Continued)

FOREIGN PATENT DOCUMENTS

| | | |
|---|---|---|
| CN | 100390549 C | 5/2008 |
| CN | 201421485 Y | 3/2010 |

(Continued)

*Primary Examiner* — Jas A Sanghera
(74) *Attorney, Agent, or Firm* — Rabin & Berdo, P.C.

(57) ABSTRACT

The present invention relates to a current sensor which measures alternating electromagnetic wave and a current breaker using the same, and the current sensor for alternating current is characterized in that it includes a sensor part arranged at a separation distance from the power wire through which alternating current is flowing; and a means of detecting alternating current by measuring the electromagnetic wave generated across the above sensor part by the electromotive force induced by the alternating current flowing through the above power wire, and in that the above means of detecting alternating current includes an amplifier.

12 Claims, 22 Drawing Sheets

(56) References Cited

U.S. PATENT DOCUMENTS

| | | | | |
|---|---|---|---|---|
| 2002/0194730 | A1* | 12/2002 | Shih | G01R 3/00 29/843 |
| 2004/0183521 | A1* | 9/2004 | Macphail | G01R 27/06 324/117 R |
| 2005/0083616 | A1* | 4/2005 | Reid | G01R 31/52 361/42 |
| 2008/0165462 | A1* | 7/2008 | Atoji | G01R 31/50 361/87 |
| 2009/0289609 | A1* | 11/2009 | Hashimoto | G01R 31/31721 323/282 |
| 2012/0112728 | A1* | 5/2012 | Bodo | G01R 21/06 323/311 |
| 2014/0009296 | A1 | 1/2014 | Li et al. | |
| 2016/0154029 | A1* | 6/2016 | Danesh | G01R 17/00 324/76.11 |
| 2016/0258984 | A1* | 9/2016 | Meehleder | G01R 15/183 |
| 2017/0074908 | A1 | 3/2017 | Nejatali et al. | |
| 2017/0168094 | A1 | 6/2017 | Chikamatsu | |
| 2018/0174724 | A1* | 6/2018 | Gao | H01F 5/02 |
| 2018/0284162 | A1* | 10/2018 | Okuyama | G01R 15/207 |

FOREIGN PATENT DOCUMENTS

| | | |
|---|---|---|
| CN | 103529342 A | 1/2014 |
| JP | H06-347489 A | 12/1994 |
| JP | H07-225251 A | 8/1995 |
| JP | H08-273952 A | 10/1996 |
| JP | 2570836 B2 | 1/1997 |
| JP | 2538300 Y2 | 6/1997 |
| JP | H10-282156 A | 10/1998 |
| JP | H10-282166 A | 10/1998 |
| JP | 2001-153895 A | 6/2001 |
| JP | 2002-340706 A | 11/2002 |
| JP | 2004-347501 A | 12/2004 |
| JP | 2006-038640 A | 2/2006 |
| JP | 2006-267118 A | 10/2006 |
| JP | 2008-185537 A | 8/2008 |
| JP | 2011-024819 A | 2/2011 |
| JP | 2011-125436 A | 6/2011 |
| JP | 2017-058288 A | 3/2017 |
| KR | 2019-880008865 U | 6/1988 |
| KR | 10-1715792 B1 | 3/2017 |
| KR | 10-2017-0078027 A | 7/2017 |
| KR | 10-2018-0054686 A | 5/2018 |
| WO | 2017/048471 A1 | 3/2017 |

* cited by examiner (a)           (b)

(c)

(a)            (b)

(a)

(b) Sensor of which the power wire And the measurement wire are Attached to each other

| Power supply(A) | Keithley 2000 Differential amplifier induced voltage (mV) |
|---|---|
| 0 | 0.287 |
| 2 | 0.60 |
| 4 | 0.99 |
| 6 | 1.39 |
| 8 | 1.78 |
| 10 | 2.18 |
| 12 | 2.59 |
| 14 | 2.99 |
| 16 | 3.39 |
| 18 | 3.79 |
| 20 | 4.21 |

(a)

(b)

US 11,092,623 B2

CURRENT SENSOR FOR MEASURING ALTERNATING ELECTROMAGNETIC WAVE AND A CURRENT BREAKER USING THE SAME

TECHNICAL FIELD

The present invention relates to a Current Sensor for Measuring Alternating Electromagnetic Wave and a Current Breaker using the same and, more particularly, relates to a current sensor that measures alternating electromagnetic wave and a current breaker using the same, wherein the current sensor directly measures the electromagnetic wave generated by the power wire (or conductor line) laid side by side with an electromagnetic wave measurement wire (or conductor line), is made smaller and simpler than the existing current sensors, and can be used to make a high reliability small power breaker.

BACKGROUND ART

Power consumption is rapidly increasing recently and accurate measurement of current has become an essential factor in the aspect of protection of power system and maximization of power use efficiency. On the side of consumers, if the demand for power is predicted and analyzed through accurate measurement of current, the efficiency can be increased and, in the aspect of a power system, the power supply system can be protected by detecting earth fault current and quickly separating the earth fault line through accurate measurement of not only the rated current but also abnormal and fault current.

The existing current measurement methods presently used for this include the followings:

First, as an alternating current sensor, there is a CT (Current Transformer) measuring an induced current generated from a power wire. It is composed of the primary power wire of which the current is to be measured, which passes through a circular magnetic material and generates a magnetic flux Φ (or an electromagnetic wave), and the secondary induced alternating current flowing in the secondary winding which depends on the turns ratio of the secondary winding. The CT has problems in that the size is three-dimensionally large, the linearity is inferior, and that the magnetic field is saturated.

Second, there is semiconductor current sensor which measures current using a Hall element and the Hall principle without using the secondary winding in the structure of the CT of the first case. It has a problem that current is measured going through complicated processes of temperature compensation and signal amplification.

Third, there is Rogowski coil current sensor, wherein the coil is wound in a circular shape without a magnetic material, through the center of which the power wire passes, and the first part of the coil enters the inside of the coil to meet the end part of the coil allowing the voltage change at both ends to be measured. As it has no magnetic saturation, can measure even a high current, and has low impedance, its signal is used being amplified and it is widely used being called an open type current sensor.

Fourth, there is an AC zero flux method (coil detection type) current sensor which makes the magnetic flux go away by additionally using a coil for magnetic flux compensation in the secondary coil part as, though a secondary coil is wound in a CT to enable the magnetic flux Φ generated in the magnetic core by alternating current to be eliminated, because the flux does not go away at low frequencies. It is a sensor of which the linearity has been greatly improved when compared with a CT.

Fifth, there is an AC/DC zero flux method (Hall element detection type) current sensor which uses a Hall element instead of the wound-type coil additionally reinforced in the AC zero flux method.

Lastly, there is a current sensor of AC/DC zero flux method (flux gate detection type) that uses a flux gate element instead of a Hall element to eliminate the remaining magnetic flux to the amplification circuit at low frequencies.

The AC zero flux method has more excellent linearity than a CT and makes measurements down to a low level with a fixed density.

But the above sensors already in use make measurements of current going through complicated processes of temperature compensation and signal amplification or have a considerable three-dimensional volume. By the way, as today's electronic devices require smaller size, smaller power consumption, and higher reliability, there is a limit in applying an existing current sensor as it is.

Meanwhile, the existing breakers that cut off overcurrent mostly use a bimetal and have a problem that aged deterioration of bimetal occurs.

SUMMARY OF THE INVENTION

Technical Problem

The present invention is developed to resolve such existing problems and the main objective is to provide a current sensor that directly measures the electromagnetic wave coming out of an alternating current wire and a simple and miniaturized high reliability power breaker using the same.

Further, an additional objective of the present invention is to provide a current sensor that can successfully perform sensing even in a harsh environment with severe external high frequency noise, while also providing a current sensor based on electromagnetic wave and induced electromotive force vulnerable to external noise.

Solution to Problem

The current sensor, according to the first aspect of the present invention developed to attain the above objective, is an alternating current sensor which measures the alternating current in the power wire that has the purpose of supplying an alternating current to a power device, and that has a voltage difference between both ends of the first input/output terminal and the second input/output terminal to enable an alternating current to flow between the above first input/output terminal and the second input/output terminal. The current sensor is characterized by what includes (1) a sensor part that contains non-coil type measurement wire laid being separated with an electric insulator by a certain distance in parallel with the power wire located between the above first input/output terminal and the second input/output terminal; and (2) a means of detecting the alternating current by measuring the electromotive force induced across the above measurement wire from the magnetic field generated by the alternating current flowing inside the power wire located between the above first input/output terminal and the second input/output terminal; and (3) a thing of which the above means to detect alternating current includes an amplifier.

More desirably, the above insulation is characterized by one or more among those formed in a group comprised of solid crystal insulating materials including air, insulating gas, pure water, insulating material, vinyl polymer insulating material or ferrite.

Also, desirably, the above sensor part shall be arranged on a polyimide substrate (150*a*) in a micro-sensor pattern (152); and is characterized in that it makes up a Flexible Printed Circuit Board to have flexibility.

The current sensor, according to the second aspect of the present invention developed to attain the above objective, is an alternating current sensor which measures the alternating current in the power wire that has the purpose of supplying an alternating current to a power device, and that has a voltage difference between both ends of the first input/output terminal and the second input/output terminal to enable an alternating current to flow between the above first input/output terminal and the second input/output terminal. The current sensor is characterized by what includes (1) a sensor part that contains non-coil type measurement wire laid being in contact with and in parallel with the power wire located between the above first input/output terminal and the second input/output terminal; and (2) a means of detecting the alternating current by measuring the electromotive force induced across the above measurement wire from the magnetic field generated by the alternating current flowing inside the power wire located between the above first input/output terminal and the second input/output terminal; and (3) a thing of which the above means to detect alternating current includes an amplifier.

And, desirably, in the cases of the current sensors according to the above first aspect and the second aspect, it would be desirable to connect a ferrite bead high frequency filter for elimination of the high frequency noise travelling through the measurement wire and a capacitor to be connected to the front end of the above amplifier.

The above measurement wire is desirable to be comprised of either a piece of one-dimensional wire, two-dimensional plane or three-dimensional tube.

And, desirably, the power wire and the measurement wire shall have a curved pattern; the above curved pattern shall gather magnetic field; and the lengths of the above power wire and the measurement wire had better be adjustable through the above curved pattern.

Also, desirably, a shield film (136) that cuts off the electromagnetic wave generated by the power wire which moves out or the electromagnetic noise entering from outside had better be additionally included.

Also, desirably, an A/D converter that changes a detected signal into a digital signal had better be additionally included.

Also, desirably, a micro-controller (220) connected to the above amplifier had better be additionally included, and the above micro-controller (220) had better be comprised of an A/D converter (221) that changes an output signal of the above current sensor (100) into a digital signal, a comparative judgment part (222) that judges the digital signal of the above A/D converter (221) by comparing the same with a set current, and a control signal generating part (223) that generates a control signal if the value measured in the above comparative judgment part (222) is bigger than the set current.

More desirably, a communication part (224) had better be additionally included, and the current sensor had better be able to communicate with external devices through the above communication part (224).

Also, desirably, the above amplifier had better be substituted with a high precision A/D converter.

Also, desirably, the means of detecting the above alternating current had better be substituted with a micro-controller (220) and the above micro-controller had better be comprised of a high precision A/D converter (221) that changes a signal into a digital signal being directly connected to an output signal of the above sensor part (100), a comparative judgment part (222) that judges the digital signal of the above A/D converter (221) by comparing the same with a set current, and a control signal generating part (223) that generates a control signal if the value measured in the above comparative judgment part (222) is bigger than the set current.

More desirably, a communication part (224) had better be additionally included, and the current sensor had better be able to communicate with external devices through the above communication part (224).

More desirably, the above measurement wire had better be an electrically conductive thin metal film.

Further, to protect the metal wire of the above power wire and the measurement wire, the above power wire and the measurement wire are required to be wrapped with an insulating material.

In the meantime, the breaker according to the third aspect of the present invention is characterized in that the above current sensor is included; and a switching means (500) that cuts off the power if the current detected is bigger than the set value as a result of comparing the output signal of the above current sensor with the set value.

Desirably, the above switching means (500) is characterized by being comprised of a signal processing part (200) that compares the output signal of the above current sensor (100) with the set value and generates a control signal if a current bigger than the set value is detected; a control transistor (330) that receives the control signal from the above signal processing part (200); and a relay (340) that cuts off the power being operated by the above control transistor (330).

Also, desirably, the above switching means (500) is characterized by being comprised of a signal processing part (200) that compares the output signal of the above current sensor (100) with the set value and generates a control signal if a current bigger than the set value is detected; and a power semiconductor switching element (350) that cuts off the power being operated by the signal generated in the above signal processing part (200).

Also, desirably, the above switching means (500) is characterized by being comprised of a comparative control part (252) that compares the output signal of the above current sensor (100) with the set value and generates a control signal if a current bigger than the set value is detected; a control transistor (330) that receives the control signal from the above comparative control part (252); and a relay (340) that cuts off the power being operated by the above control transistor (330).

Also, desirably, the above switching means (500) is characterized by being comprised of a comparative control part (252) that compares the output signal of the above current sensor (100) with the set value and generates a control signal if a current bigger than the set value is detected; and a power semiconductor switching element (350) that cuts off the power being operated by the signal generated in the above comparative control part (252).

More desirably, the above signal processing part (200) includes a micro-controller (220) connected to the above current sensor; and the above micro-controller (220) is characterized by being comprised of an A/D converter (221) that changes an output signal of the above current sensor (100) into a digital signal, a comparative judgment part (222) that judges the digital signal of the above A/D converter (221) by comparing the same with a set current, and a control signal generating part (223) that generates a control signal if the value measured in the above comparative judgment part (222) is bigger than the set current.

Far more desirably, the above signal processing part (200) is characterized by being comprised of an amplifier (210) connected to the above current sensor and a micro-controller (220) connected to the above amplifier (210).

Most desirably, a communication part (224) shall be additionally included, and the breaker shall be characterized in that it can communicate with external devices through the above communication part (224).

Additionally, a current-sensor system includes a current-sensor part, microcontroller, a communication part and a control part.

Effects of the Invention

The present invention is a current sensor which directly measures the electromagnetic wave generated by the power wire with a measurement wire arranged in parallel with it and is smaller and simpler than the existing current sensors and, when it is applied to a power breaker, a small power breaker with high reliability can be provided.

If a ferrite bead and a capacitor are used as a high frequency noise filter, in particular, current can be sensed successfully even in a harsh environment with severe external noise.

DETAILED DESCRIPTION OF EMBODIMENTS

The present invention can be described in detail as follows referring to the attached drawings:

(Current Sensor According to the First Aspect of the Present Invention)

First, the current sensor which is the first aspect of the present invention is described referring to FIGS. 1 to 17.

Figure 6:
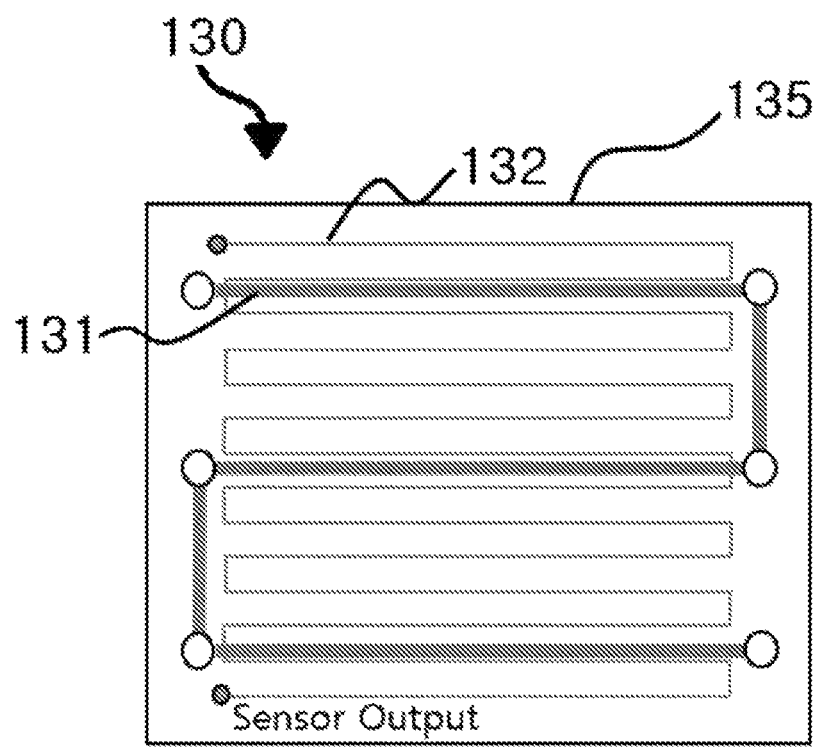
FIG. 6 is the rough schematic diagram of the sensor part for the current sensor in the second embodiment of the present invention.
Figure 7:
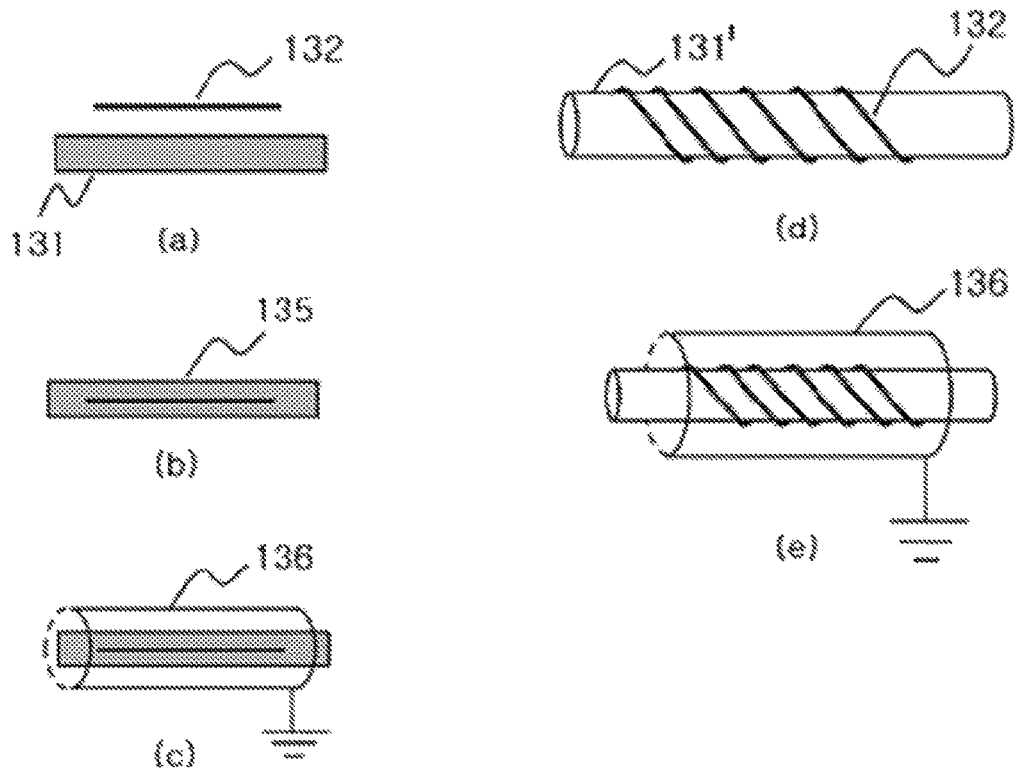
FIG. 7 shows the variant examples of the sensor part for the current sensor in the second embodiment.
Figure 8:
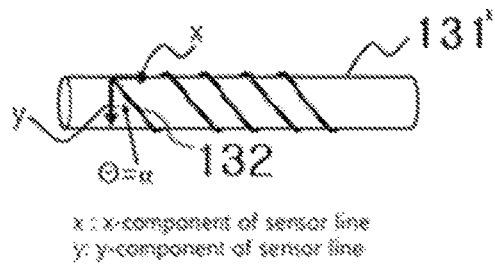
FIG. 8 is a graph that shows the structural chart and data characteristics of the power wire and measurement wire of the current sensor in the second embodiment.
Figure 8:
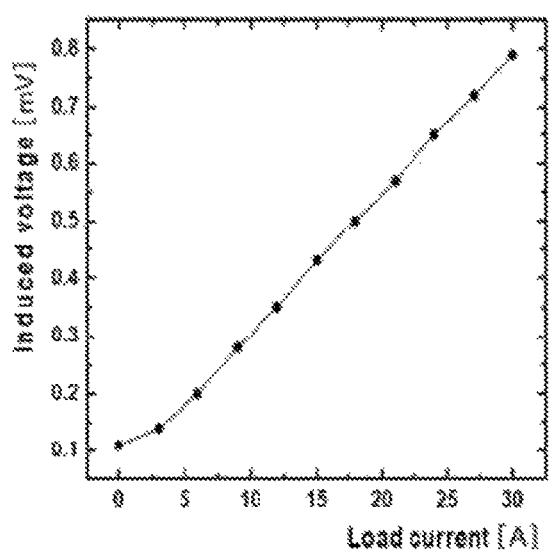
Figure 9:
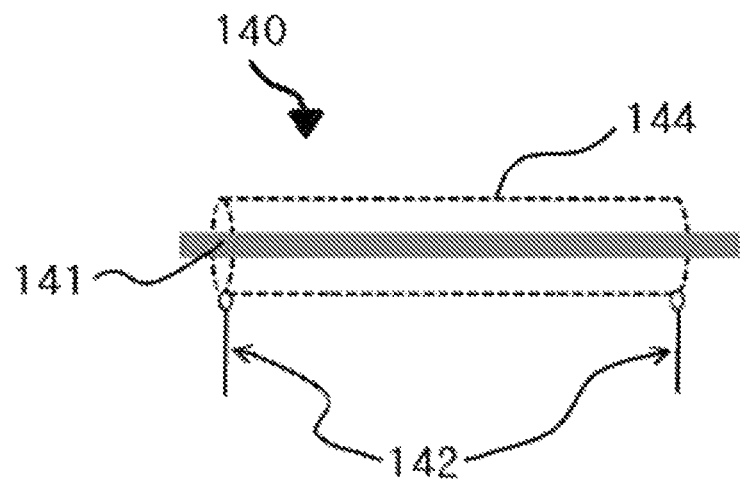
FIG. 9 is the rough schematic diagram of the sensor part for the current sensor in the third embodiment of the present invention.
Figure 10:
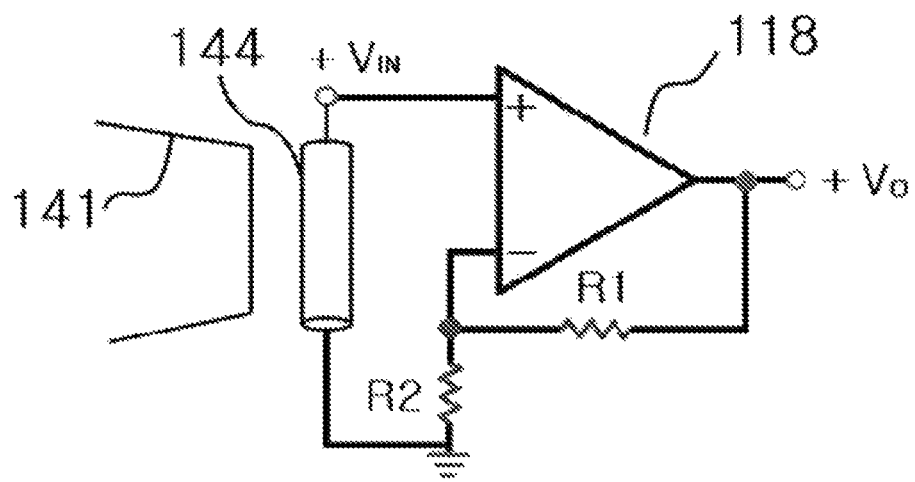
FIG. 10 is a rough circuit diagram of the current sensor in to the third embodiment.
Figure 11:
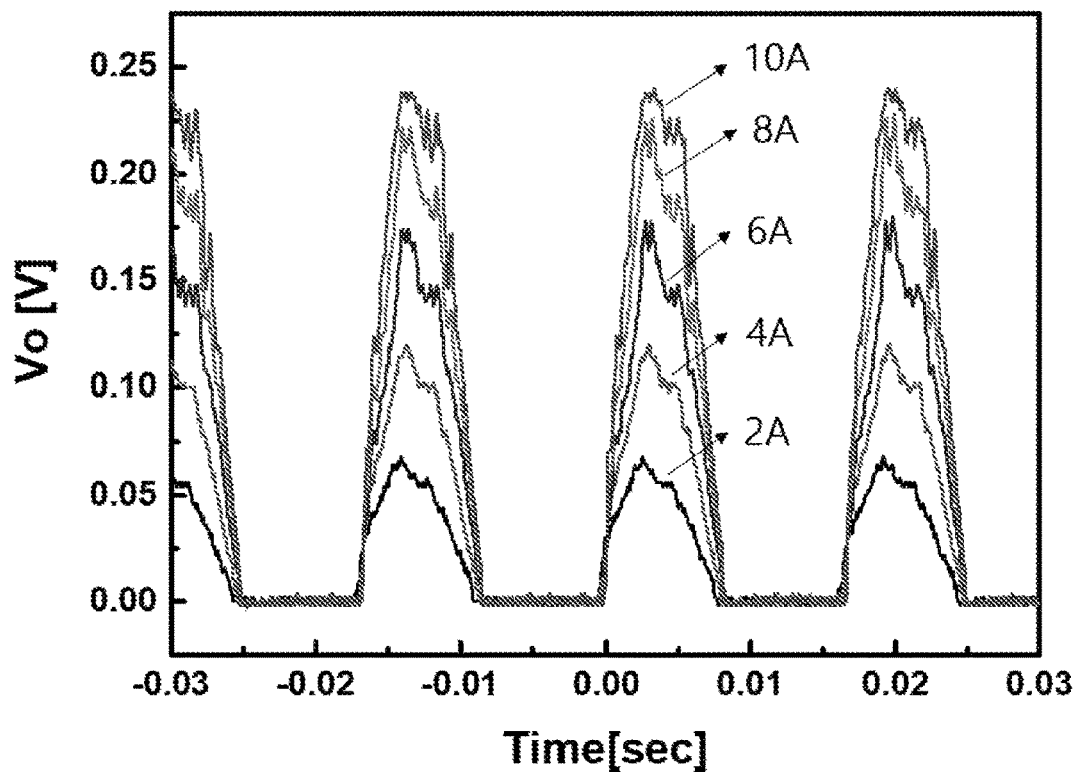
FIG. 11 is a graph that shows the voltage characteristics by current measured using the current sensor in the third embodiment.
Figure 12:
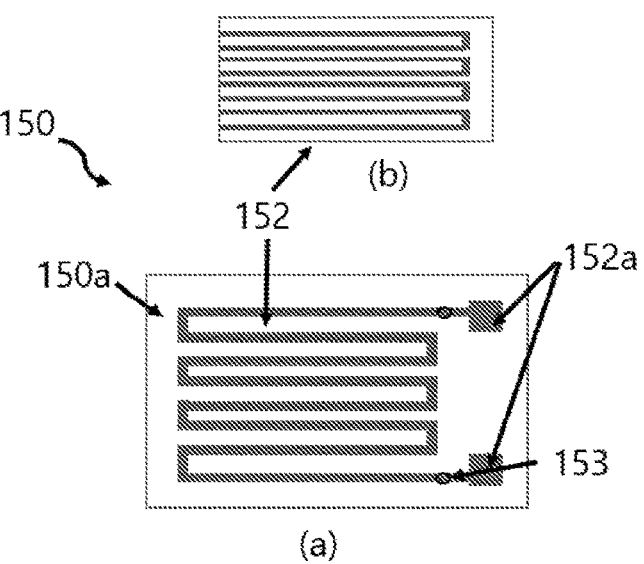
FIG. 12 is a detailed photo of the micro-sensor part for the current sensor in the fourth embodiment of the present invention.
Figure 13:
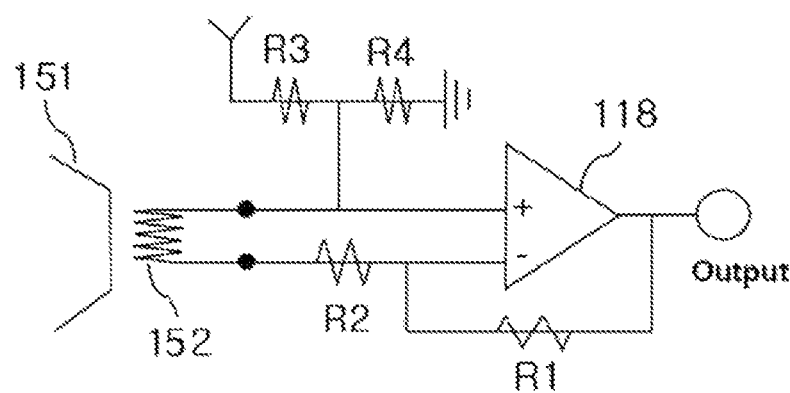
FIG. 13 is the rough circuit diagram of the current sensor in the fourth embodiment.
Figure 14:
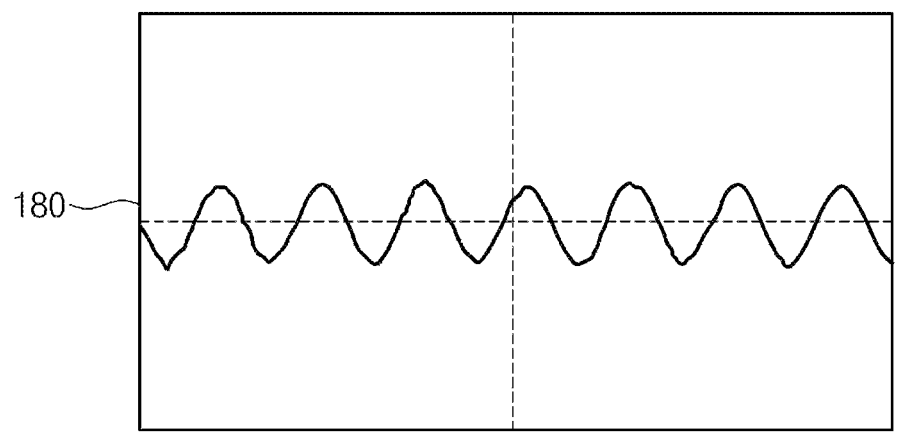
FIG. 14 is the oscilloscope waveform diagram measured by the current sensor in the fourth embodiment.
Figure 15:
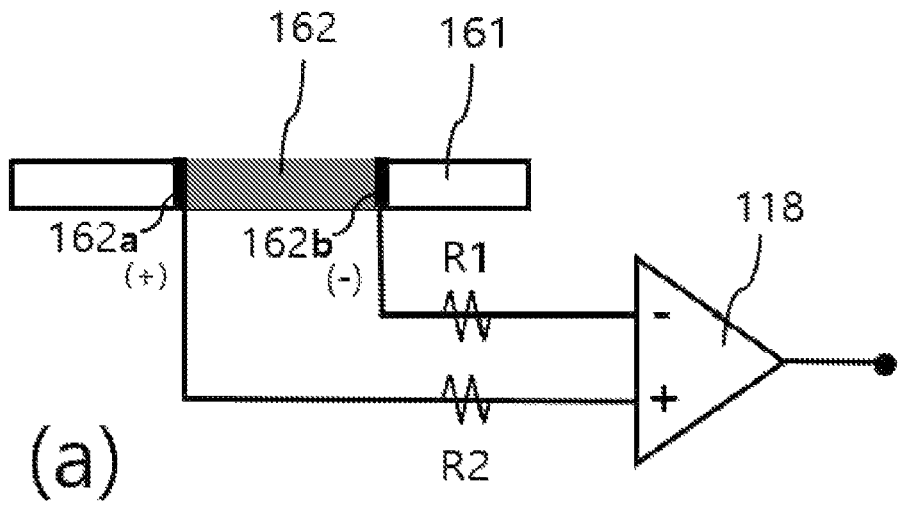
FIG. 15 is the rough schematic diagram and the sensor part photograph of the current sensor in the fifth embodiment.
Figure 15:
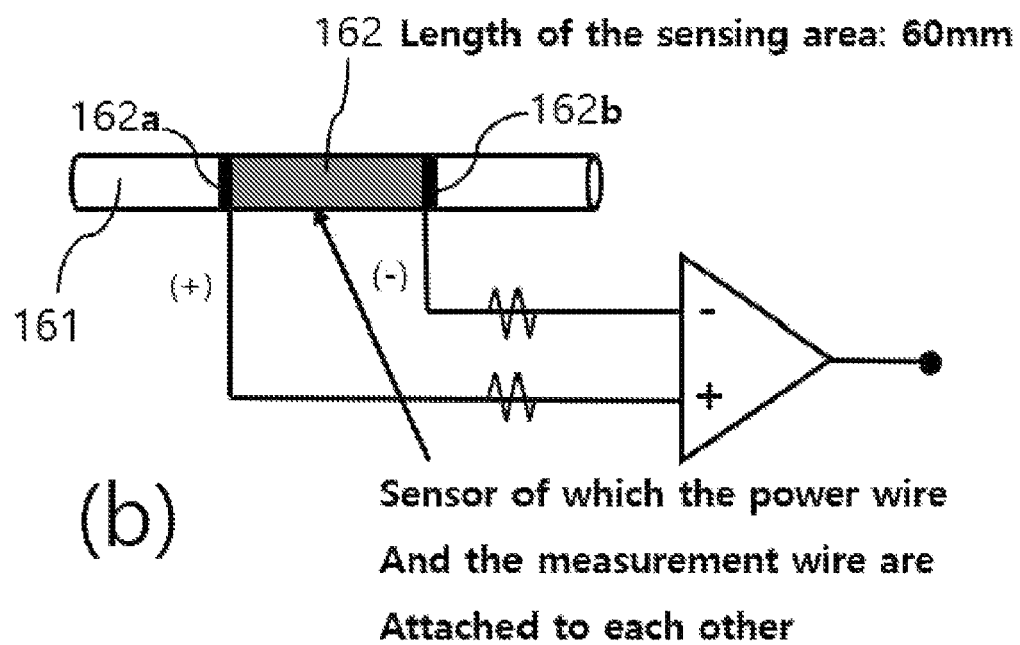
Figure 16:
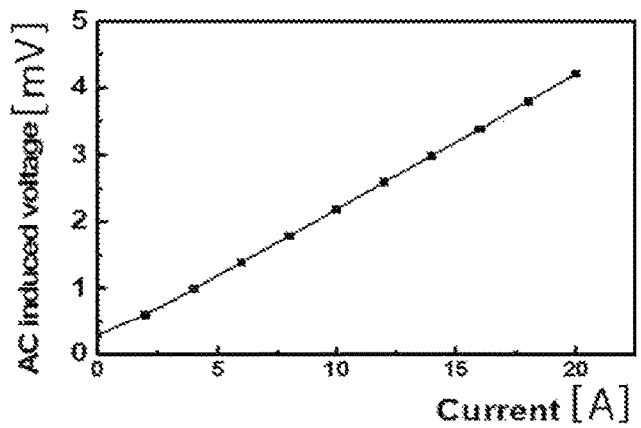
FIG. 16 is the data and graph measured by the current sensor in the fifth embodiment.
Figure 17:
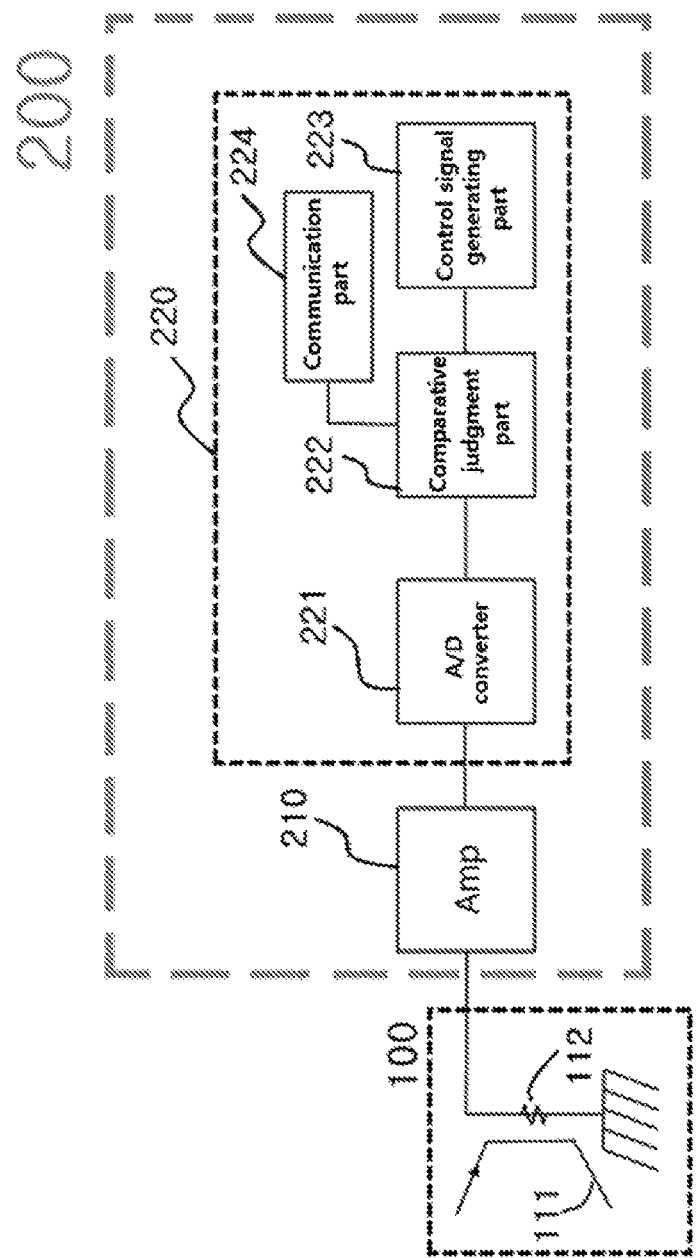
FIG. 17 is the block diagram of the current sensor in the sixth embodiment of the present invention.

FIGS. 1 to 5 are the reference drawings for the description of the current sensor in the first embodiment of the present invention, FIGS. 6 to 8 are the reference drawings for the description of the current sensor in the second embodiment of the present invention, FIGS. 9 to 11 are the reference drawings for the description of the current sensor in the third embodiment of the present invention, FIGS. 12 to 14 are the reference drawings for the description of the current sensor in the fourth embodiment of the present invention, FIGS. 15 to 16 are the reference drawings for the description of the current sensor in the fifth embodiment of the present invention, and FIG. 17 is the reference drawing for the description of the current sensor in the sixth embodiment of the present invention.

First, to explain the principle of the proposed current sensor of the present invention, Faraday's Law which is the Maxwell's third law of electromagnetic induction is that a varying magnetic field creates an electric field and the fourth law of Maxwell is that a time varying electric field creates a magnetic field. Alternating current creates a varying magnetic field and, when a metal conductor is placed inside the varying magnetic field, an induced current is generated. This induced current is formed in the direction perpendicular to the magnetic field as per the Maxwell-Faraday Law. According to this law, if a wire that measures the electromagnetic wave coming out of a power wire in which time-varying alternating current flows is arranged in parallel with the power wire, the induced current can be measured.

The measurement wire arranged in parallel with that power wire is called an electromagnetic current sensor. This measurement wire can be comprised of either a piece of one-dimensional wire, two-dimensional plane or three-dimensional conductive tube. And, as the measurement wire means a conductor with no inductance, not a coil with an inductance, it is hereinafter called 'non-coil type measurement wire' in this statement. And the measurement line which is the measurement wire parallel with the power wire is also called a suspension line.

Further, this current sensor is technically characterized in that, it can be applied to produce a breaker which cuts off the power from the power wire by generating an electromagnet control signal when the value obtained by amplifying the small signal of the sensor is found to be bigger than the set value as a result of entering it into a comparator or an A/D (Analog Digital) converter for comparison.

(Current Sensor in the First Embodiment)

Figure 1:
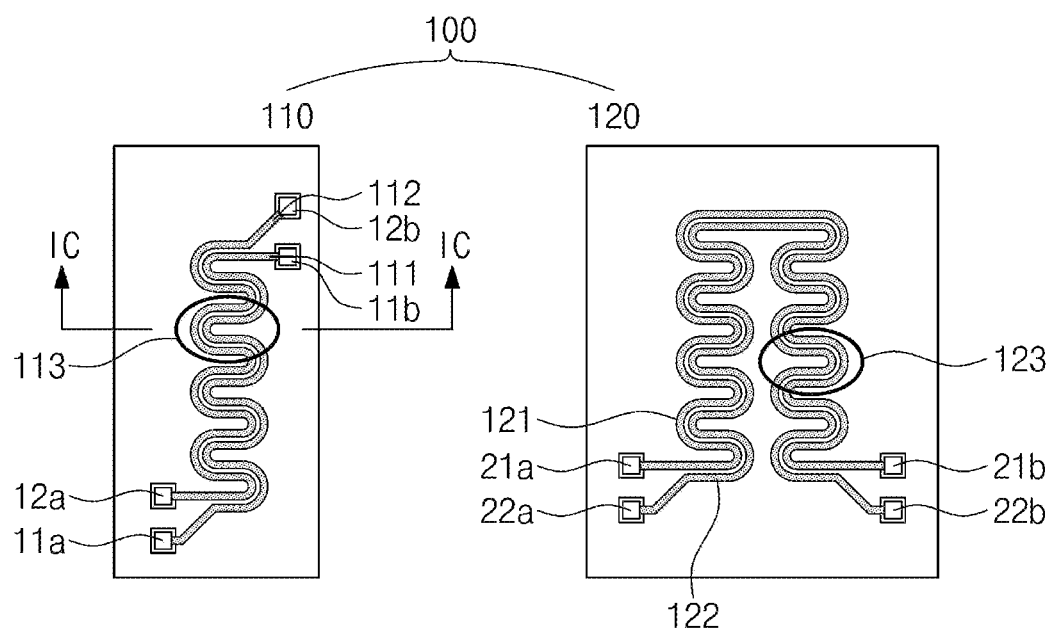
FIG. 1 is a PCB photo and the sectional view of the sensor part for the current sensor according to the first embodiment of the present invention.
Figure 1:
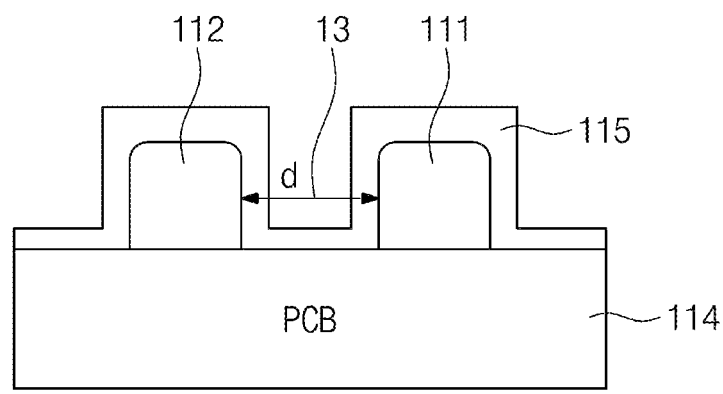
Figure 2:
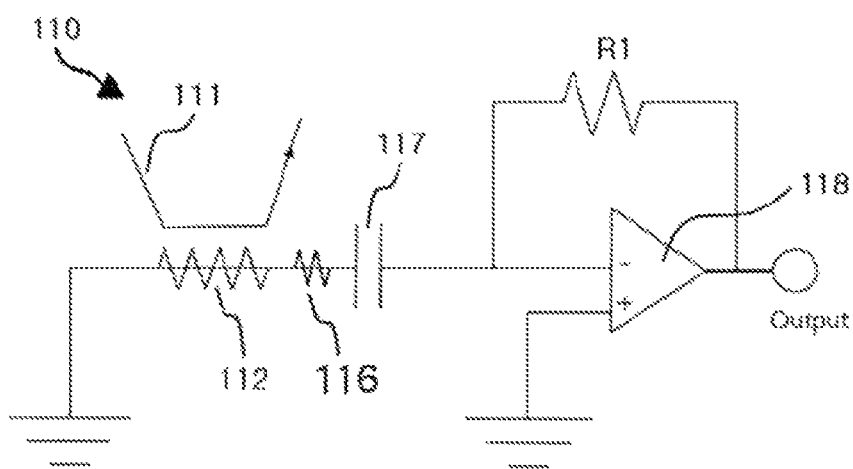
FIG. 2 is the rough circuit diagram of the current sensor in the first embodiment.
Figure 3:
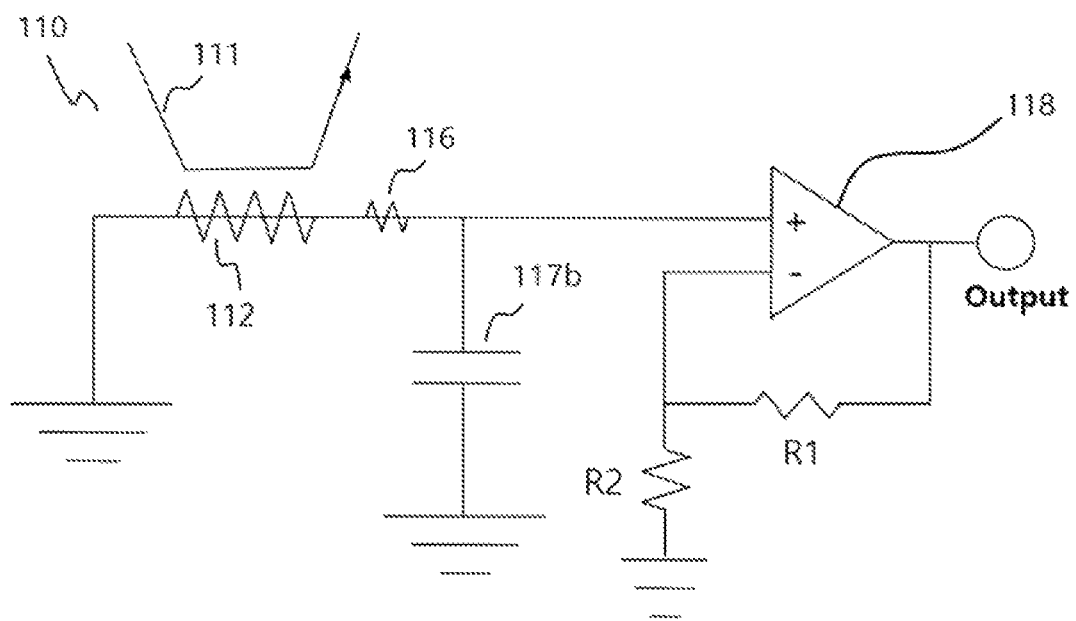
FIG. 3 is the rough circuit diagram of a current sensor's variant example in the first embodiment.
Figure 4:
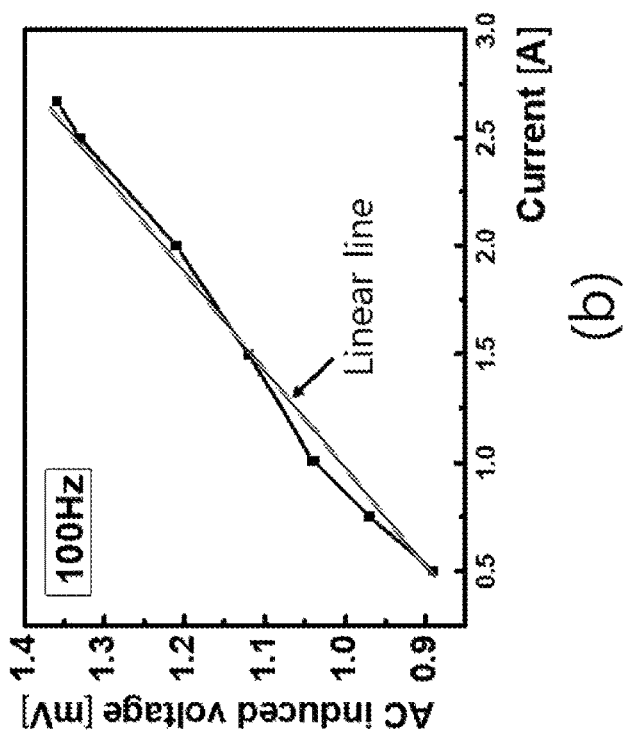
FIG. 4 is the data and graph obtained by measuring 100 Hz alternating current using the current sensor in the first embodiment.
Figure 5:
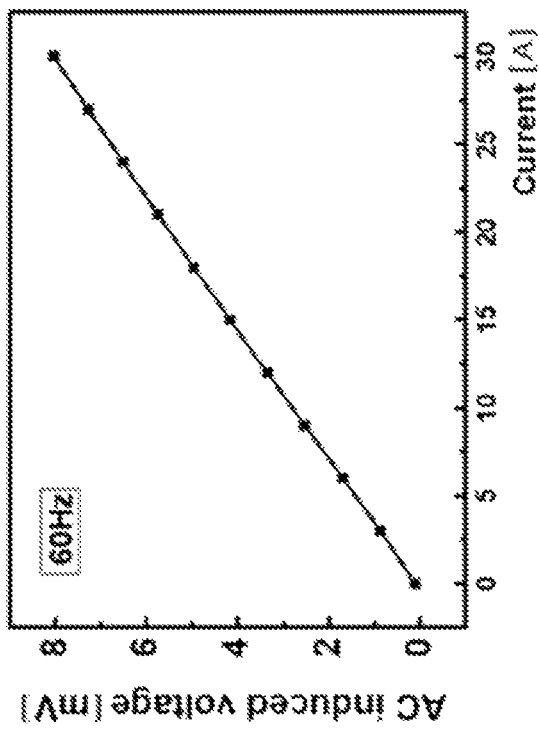
FIG. 5 is the data and graph obtained by measuring 60 Hz alternating current using the current sensor in the first embodiment.

First, to explain the current sensor according to the first embodiment of the present invention referring to FIGS. 1 to 5, FIG. 1 is the PCB photo and sectional view of the sensor part for the current sensor in the first embodiment of the present invention, wherein FIG. 1(a) is the PCB photo of the sensor part that has a single curved part, FIG. 1(b) is the PCB photo of the sensor part that has a dual curved part, and FIG. 1(c) is the sectional view along the line 1C-1C of the cut plane of 1(a). FIG. 2 is the rough circuit diagram in the first embodiment, FIG. 3 is the rough circuit diagram of the current sensor's variant example in the first embodiment, FIGS. 4(a) and (b) are the data and graph obtained by measuring 100 HZ alternating current using the current sensor in the first embodiment respectively, and FIGS. 5(a) and (b) are the data and graph obtained by measuring 60 HZ alternating current using the current sensor in the first embodiment respectively, The current sensor (100, 110, and 120) in this embodiment is, as illustrated in FIG. 2, comprised of the sensor part (110) of the current sensor in which the power wire (111) and the measurement wire (112) are arranged in parallel and the amplification part (118, R1) that amplifies the induced electromagnetic wave sensed at the above sensor part (110).

In general, as the current induced across the above sensor part (110) is small, the voltage measured is small. Accordingly, an amplification circuit (118, R1) is required and, in the embodiment in FIG. 1, an amplification part that has operational amplification (118) is proposed.

That is to say, FIG. 2 is the circuit diagram where the signal is amplified by connecting an operational amplifier (118) to the amplification part (110) of the current sensor, and the capacitor (117) for direct current cutoff and combination and/or the high frequency noise filter bead (116) may be left out in some cases. However, as the signal sensed in the above sending part is weak, it is desirable to add them to reduce the error.

To describe the sensor part (110) in detail, as shown in FIG. 1(a), the sensor part of the current sensor is illustrated in which the power wire (111) which has the first input/output terminal '11a' and second input/output terminal '11b' and the measurement wire (112) which has the first input/output terminal '12a' and second input/output terminal '12b' are arranged in parallel on a two-dimensional plane. The reason why there are curves in the two adjacent wires is to strongly gather the magnetic field to the curved pattern (113) part or to make the length longer within the limited size of an area.

FIG. 1(b) shows that the power wire (121) is arranged in the curved form as letter 'S' or '김' from the direction moving away from the first or second input/output terminal (21a, 21b) to the direction moving closer to the other one, and the measurement wire (121) too is arranged in parallel with the power wire (121) in the curved form as letter 'S' or '김' from the direction moving away from the first or second input/output terminal (22a, 22b) to the direction moving closer to the other one and, as the length and size of the current sensor depend on the magnitude of the current, a dual curved pattern is shown to have been formed to gather the magnetic field more strongly to the curved pattern (123) part or make the length longer within the limited size of an area.

Here, the measurement wire is a certain separation distance (d) (refer to FIG. 1(c)) away from the power wire, which is expressed mathematically as d( ) and, desirably, the separation distance is filled with an insulating material. However, if the separation distance is practically near zero (d≈0), it means that the power wire and the measurement wire are electrically attached together with no insulating material. At this time, as there is a very strong magnetic field (magnetic field B∝I/d, I is the current and d is the separation distance) in the attached wires, a very big electromagnetic signal can be obtained. However, it has a problem that, as the power wire and the signal wire are attached to each other, if the things go wrong, big power may flow through the signal line into the measurement system to destroy it. The above insulating material includes air, insulating gas (or $SF_6$ gas), pure water, insulating material, vinyl polymer insulating material, or solid crystal insulating material. The solid crystal insulating material includes ceramic material. If ferrite is used also as a high frequency filter that eliminates high frequency noise, that high frequency filter may be attached between the measurement wire and the amplifier to capture the high frequency noise coming in via the measurement wire.

The description of this embodiment relates to the current sensor of the case wherein the power wire and the measurement wire are at a certain separation distance (d) away from each other (d≠0).

Meantime, as a variant example of the first embodiment, FIG. 3 shows the circuit diagram where the operational amplifier (118) is used as a non-inverting amplifier.

That is to say, the current sensor in FIG. 2 described above is an embodiment wherein the operational amplifier (118) is used as an inverting amplifier circuit along with the first resistor (R1), and the current sensor in FIG. 3 is the circuit diagram of a variant example wherein the operational amplifier (118) is used as a non-inverting amplifier circuit along with the first and second resistors (R1, R2).

When FIG. 4(a) is referred to as an example of such an experiment, it shows the alternating voltage and current data of the electromagnetic wave induced by 100 Hz alternating current that is measured using the proposed current sensor. The graph is drawn using the data of FIGS. 4(b) and 4(a) and shows linearity wherein the induced voltage of the vertical axis proportionally increases on the whole as the alternating current of the horizontal axis increases.

Also, when FIG. 5(a) is referred to as another experiment example, it shows the current dependency data of the voltage induced by 60 Hz alternating current which is measured using the proposed current sensor. The graph is drawn using the data of FIGS. 5(b) and 5(a) and shows linearity wherein the induced voltage of the vertical axis also proportionally increases on the whole as the alternating current of the horizontal axis increases.

(Current Sensor in the Second Embodiment)

Meanwhile, to describe the current sensor in the second embodiment of the present invention referring to FIGS. 6 to 8, FIG. 6 is the rough schematic diagram of the sensor part for the current sensor in the second embodiment of the present invention, FIGS. 7(a) to (e) are variant examples of the sensor part for the current sensor in the second embodiment, and FIGS. 8(a) and 8(b) are the graphs that show the structural chart and the data characteristics of the power wire and the measurement wire of the current sensor in the second embodiment respectively.

Though the current sensor in this embodiment is basically same as that in the first embodiment, there is a difference in the sensor part, and, as shown in FIG. 6, the sensor part in this embodiment shows that the power wire (131) and the measurement wire (132) are arranged being combined on the combined substrate (135) of the power wire (131) and the measurement wire (132). That is to say, it shows that the power wire (131) can be arranged on one side of the combined substrate (135) in a curved form and the measurement wire (132) can be arranged in parallel with it or the measurement wire (132) can be arranged on the other side of the combined substrate (135) in a curved form.

That is to say, the current sensor in this embodiment is characterized in that the wires can be arranged in parallel on the same layer of a two-dimensional plane or can be arranged on difference layers being stacked.

Meanwhile, as variant examples of the second embodiment, the variant examples of the sensor part wherein the power wire (131) and measurement wire (132) are configured in different forms are shown.

As in FIGS. 7(a) and 7(b), the measurement wire (132) can be arranged on, below, or at the side of the power wire (131) individually configured, and a combined substrate (135) of the power wire (131) and the measurement wire (132) can be configured by arranging the power wire (131) and the measurement wire (132) being combined together.

FIGS. 7(c) and 7(e) shows an earthed shield film (136) that covers the power wire (131) and the measurement wire (132), and the shield film is technically characterized in that it cuts off electromagnetic wave going outside and also cuts off the electromagnetic wave generated by other power wire coming inside.

Also, the measurement wire (132) can be arranged being wound on the power wire (131') as shown in FIG. 7(d) and the power wire (131') at this time should be a power wire which has insulating coating such as vinyl cover, and FIG. 8(a) shows that the measurement wire (132) is wound on the power wire (131') slantingly at a random angle (θ=α) and, as the current of the slant measurement wire (132) is physically a vector quantity, the slantingly flowing current can be considered being divided into x axis and y axis. Accordingly, as in FIG. 8(a), the x axis is parallel with the power wire (131') and, even if the measurement wire (132) is wound on the power wire (131'), as there is a component that is parallel with the power wire (131'), electromagnetic wave signal is detected on the measurement wire (132). FIG. 8(b) is the data measured using the measurement wire (132) wound on the power wire (131') and shows linearity wherein the induced current of the vertical axis proportionally increases on the whole as the alternating current of the horizontal axis increases.

Also, as shown in FIG. 7(e), the technical characteristic is that a shield film (136) can be formed to enable the measurement wire (132) wound on the power wire (131') to be fixed and stabilized, which cuts off electromagnetic wave going outside and also the electromagnetic wave generated by other power wire coming inside, the above shield film (136) can be connected to earth and can be used to simply produce a small size large current measurement system.

(Current Sensor in the Third Embodiment)

To describe the current sensor in the third embodiment of the present invention referring to FIGS. 9 to 11, FIG. 9 is the rough schematic diagram of the sensor part for the current sensor in the third embodiment of the present invention, FIG. 10 is the rough circuit diagram of the current sensor in the third embodiment, and FIG. 11 is the graph of the voltage characteristics by current measured using the current sensor in the third embodiment.

In the case of the current sensor in this embodiment, a one-way amplifier circuit (118, R1, R2) can be organized using a power wire (141), conductive tube for measurement (144) and an amplifier (118), and the conductive tube for measurement (144) can be said to be parallel with the power wire.

At this time, the sensor part (140) in this embodiment, as shown in FIG. 9, is characterized in that the adjacent part of the measurement wire (142) among the power wire (141) and the measurement wire (142) is used as the conductive tube for measurement (144) which is a three-dimensional conductive tube. Though the above power wire (141) may be a covered electric wire, it is not necessarily limited to that.

That is to say, in the case of this embodiment, it is shown that electromagnetic wave in the power wire (141) of the current sensor can be detected through the conductive tube for measurement which is a 3-dimensional conductive tube.

Therefore, according to the embodiments 1 to 3 of the present invention, the measurement wire (142) of the current sensor in the present invention is characterized in that it can be comprised of either a piece of one-dimensional wire, two-dimensional plane, or three-dimensional conductive tube depending on the arrangement.

Meantime, when FIG. 11 is referred to as an example of experimenting the current sensor in the third embodiment, it shows that, the voltage of the sensor measured increases together as the alternating current increases. It shows that the minus part signal has been eliminated by applying single power to the relevant amplifier and only the plus part has been measured. Accordingly, it more clearly shows the dependency of the current sensor signal measured with a one-way amplifier on alternating current.

The current sensor in the third embodiment is technically characterized in that the breaker can be operated through the measured signal and the conductive tube for measurement (144) parallel with the power wire (141) can make measurement of large current easy.

(Current Sensor in the Fourth Embodiment)

To continue describing the current sensor in the fourth embodiment of the present invention referring to FIGS. 12 to 14, FIG. 12(a) is a detailed photo of the micro-sensor part for the current sensor in the fourth embodiment of the present invention, FIG. 12(b) is the detailed photo of the micro-sensor pattern of FIG. 12(a), FIG. 13 is the rough circuit diagram of the current sensor in the fourth embodiment, and FIG. 14 is the oscilloscope waveform diagram measured with the current sensor in the fourth embodiment.

In the case of the current sensor in this embodiment, a two-way amplifier circuit as shown in FIG. 13 can be organized using a power wire (111), measurement wire (112) and an amplifier (118) and, though a half of the measurement wire is parallel with the power wire, the remaining half can be formed in the other direction depending on the sensor pattern.

Accordingly, when FIG. 14 is referred to as an example of experimenting this through a two-way amplifier circuit, as it shows the image (180) of the oscilloscope measured at power current 6[A], it indicates that a phenomenon can occur where the signal of the sensor parallel with the power wire (111) and the signal of the opposite sensor cancel each other.

The sensor part (150) of the current sensor in this embodiment, as shown in FIG. 12, is characterized in that the pattern is formed on a flexible copper film.

The technical characteristic is that a flexible current sensor that can be applied to a wearable device can be produced by arranging a micro-sensor pattern (152) (refer to FIG. 12(b)) on a polyimide substrate (150a) which is a flexible substrate, connecting it through a via (153), and arranging an electrode pad (152a).

The technical characteristic is that current sensors of diverse forms can be produced as, in some cases, the PCB substrate can be produced being stacked and current sensors can also be made as micro current sensors using a semiconductor process.

(Current Sensor in the Fifth Embodiment)

Now, to describe the current sensor in the fifth embodiment of the present invention referring to FIGS. 15 and 16, FIGS. 15(a) and (b) are the rough schematic diagram and the sensor part photo of the current sensor in the fifth embodiment respectively, and FIGS. 16(a) and (b) are the data and graph measured with the current sensor of the fifth embodiment respectively.

The current sensor in this embodiment is an embodiment example of a case wherein the power wire and the measurement wire are electrically attached with no separation distance (d=0).

First, as shown in FIG. 15(b), the cover of the alternative current power wire (151) is peeled off to from a 6 cm long sensing area (162), an electromagnetic wave measurement terminal is connected to each end of the above sensing area respectively, each of which is connected to Keithley 2000 differential amplifier, and then the induced voltage is measured at the output terminal of the amplifier while changing the current flowing through the power wire.

The data in FIG. 16 shows that the electromagnetic signal linearly increases depending on the current flowing through the power wire.

If it is assumed that the material of the measurement wire (112) in the first embodiment is same as that of the power wire (111) and the two are electrically connected, it can be considered to be equivalent to this embodiment wherein the 6 cm long measurement area (162) is parallel with the power wire (161). It means that there is no practical separation distance between the power wire and the measurement wire. In general, the magnetic field, in this case, is inversely proportional to the separation distance (magnetic field $B \propto I/d$, where I is the current and d is the separation distance). The fact that there is no separation distance means that the maximum magnetic field exists in that wire, as a result of which the maximum size of electromagnetic wave exists in that wire. Though it can be an advantage, there is a risk for the measurement equipment to be destroyed due to a short-circuit phenomenon with the measurement equipment.

(Current Sensor in the Sixth Embodiment)

Lastly, to describe the current sensor in the sixth embodiment of the present invention referring to FIG. 17, FIG. 17 is the block diagram of the current sensor in the sixth embodiment of the present invention.

The current sensor in this embodiment, as shown in FIG. 17, is a current sensor created by combining a sensor part (100) and a signal processing part (200), wherein the signal processing part (200) is characterized by being comprised of an amplifier and a one-chip micro-controller (220), and can be considered to have been made by connecting a one-chip micro-controller (220) to the current sensor in the first embodiment (refer to FIG. 2).

That is to say, the current sensor (100, 210) can be connected to an A/D (Analog-Digital) converter and a one-chip micro-controller (220) embedded with a communication function. Also, the current sensor (100, 210) can be connected to a one-chip micro-controller (220) embedded with A/D (Analog-Digital) converter and communication functions.

However, if the sensor part (100) of the current sensor is connected to an A/D converter (221) with good resolution which has low standard voltage, the sensor part (100) itself of the current sensor can be used as a sensor as it is without an amplifier (210). That is to say, the A/D converter (221) with a resolution of over 16 bit can take the role of the amplifier (210) instead. In the case of an A/D converter (221) with bad resolution which has high standard voltage, the amplifier (210) had better be arranged before the A/D converter (221) and after the sensor part (100) of the current sensor.

Also, if a micro-controller is connected and used as in this embodiment, the technical characteristic is that an output signal of the current sensor is converted in the A/D converter into a digital signal, which is judged by the comparative judgment part (222) by comparing it with the standard voltage or a set current, and the control signal generating part (223) generates a control signal if the value measured in the above comparative judgment part (222) is bigger than the set current.

Also, the technical characteristic is that a communication part (224) can be additionally included, through which the current sensor (110) can communicate with external devices. This will be described later referring to FIG. 22.

(Breaker According to the Second Aspect of the Present Invention)

Now, a breaker which uses the current sensor according to the second aspect of the present invention is described referring to FIGS. 18 to 23.

Figure 18:
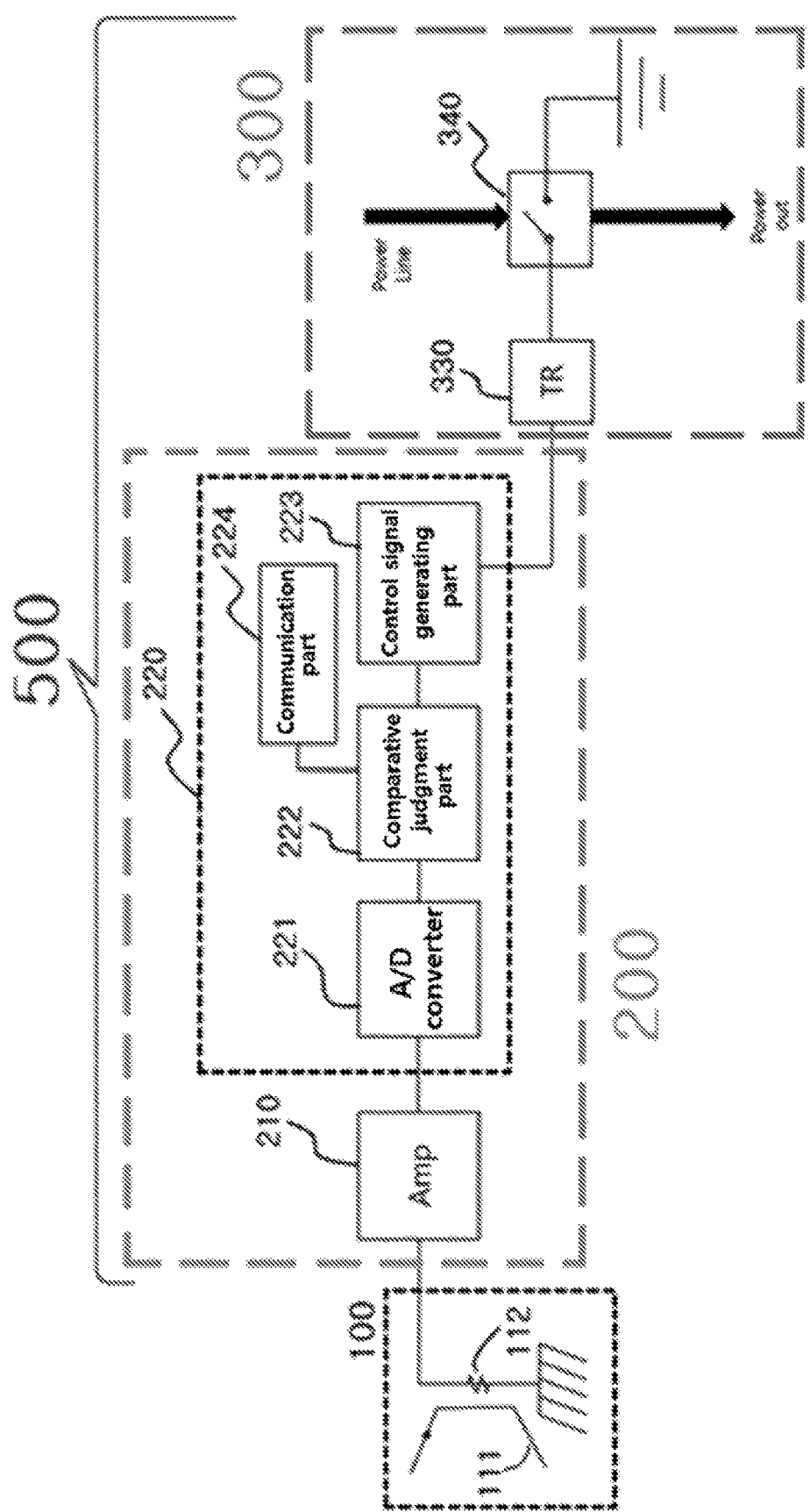
FIG. 18 is the block diagram of the first embodiment of the breaker according to the second aspect of the present invention.
Figure 19:
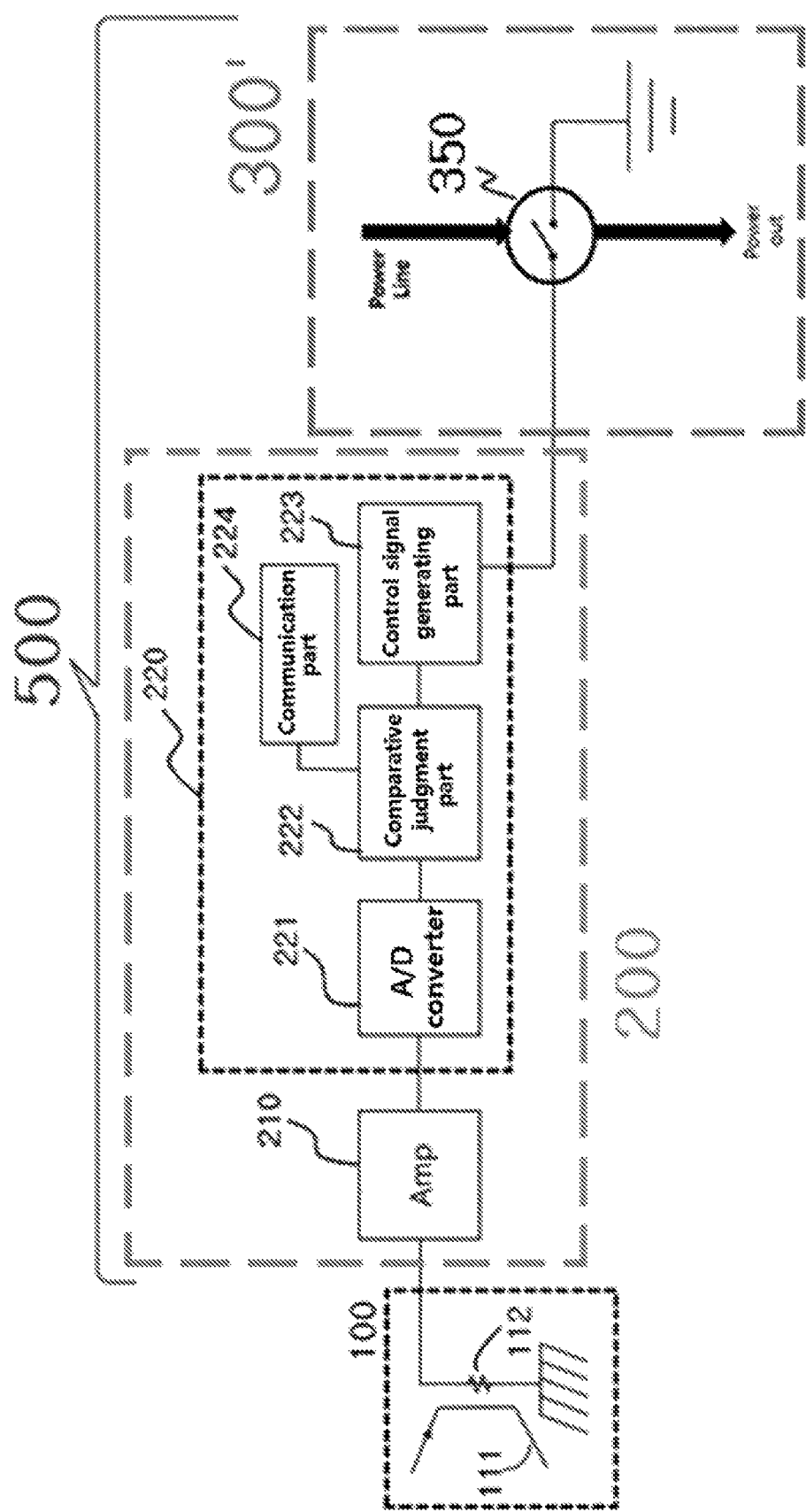
FIG. 19 is the block diagram of the breaker that corresponds to a variant example of the embodiment according to FIG. 18.
Figure 20:
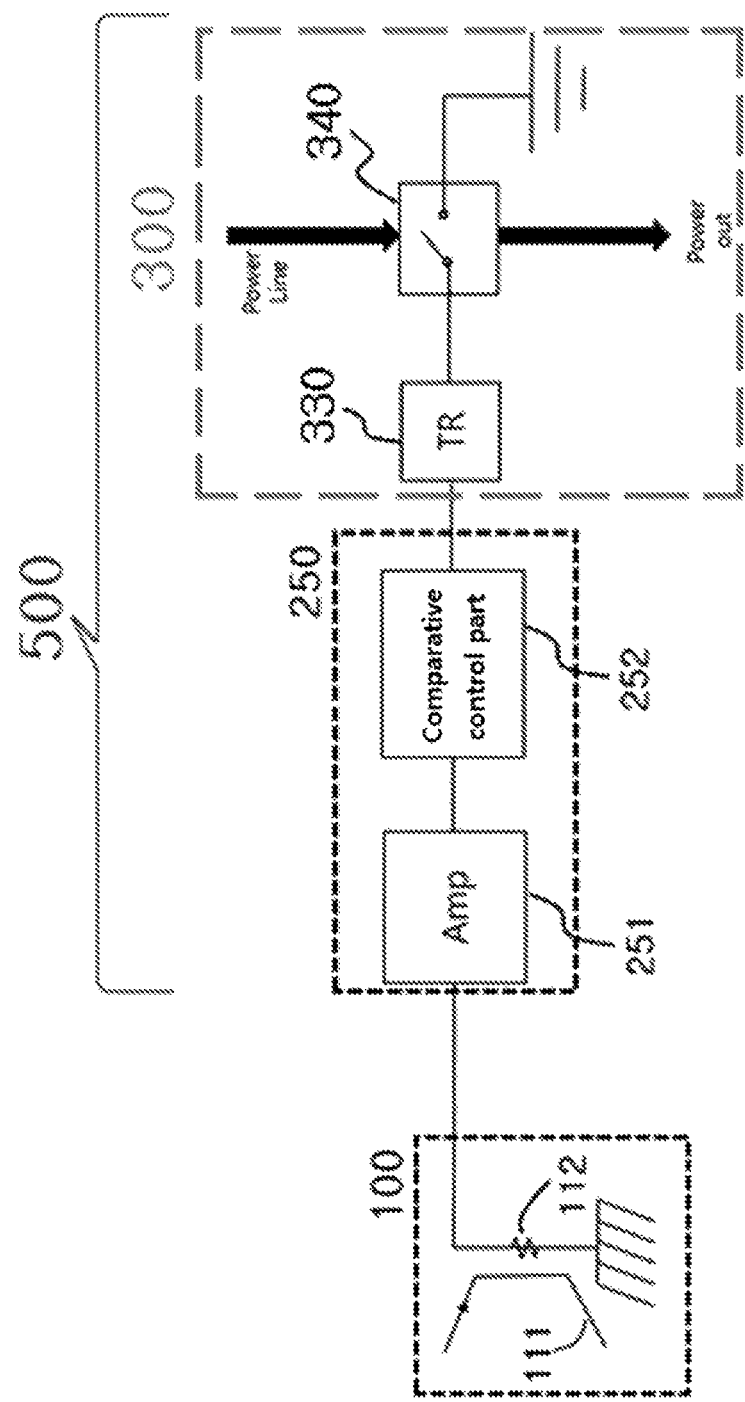
FIG. 20 is the block diagram of the second embodiment of the breaker according to the second aspect of the present invention.
Figure 21:
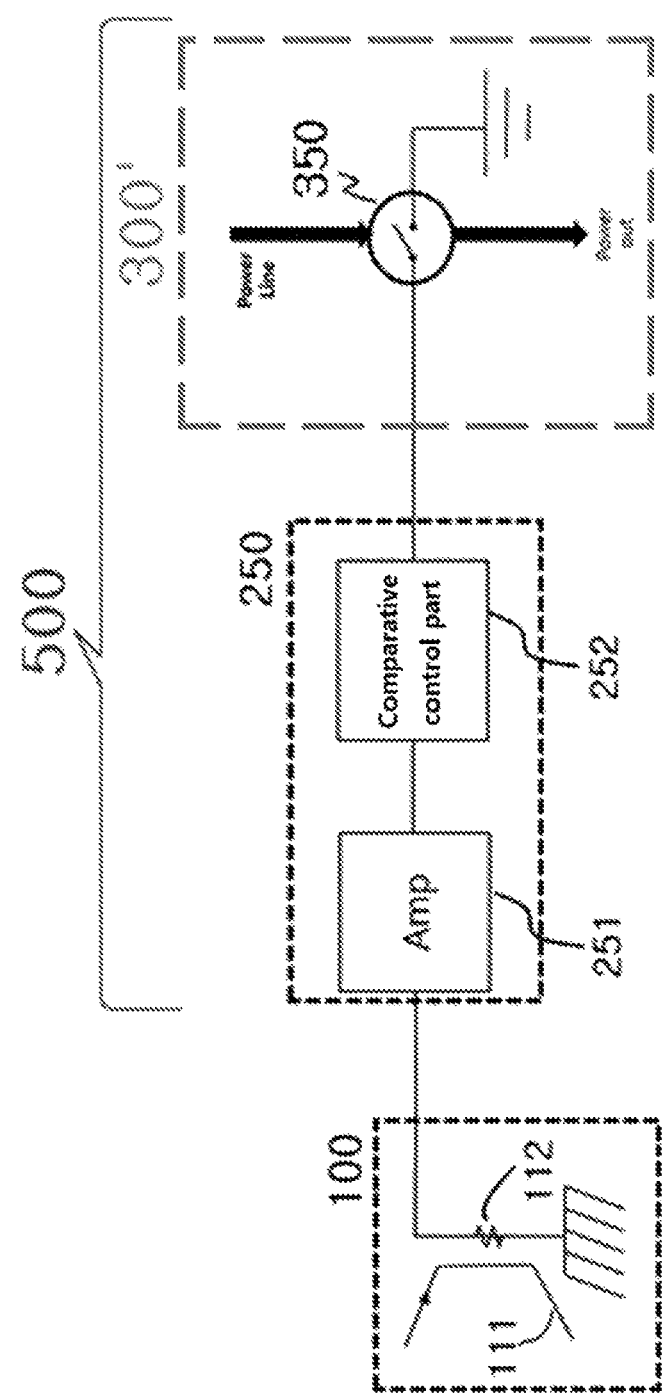
FIG. 21 is the block diagram of the breaker that corresponds to a variant example of the embodiment according to FIG. 20.
Figure 22:
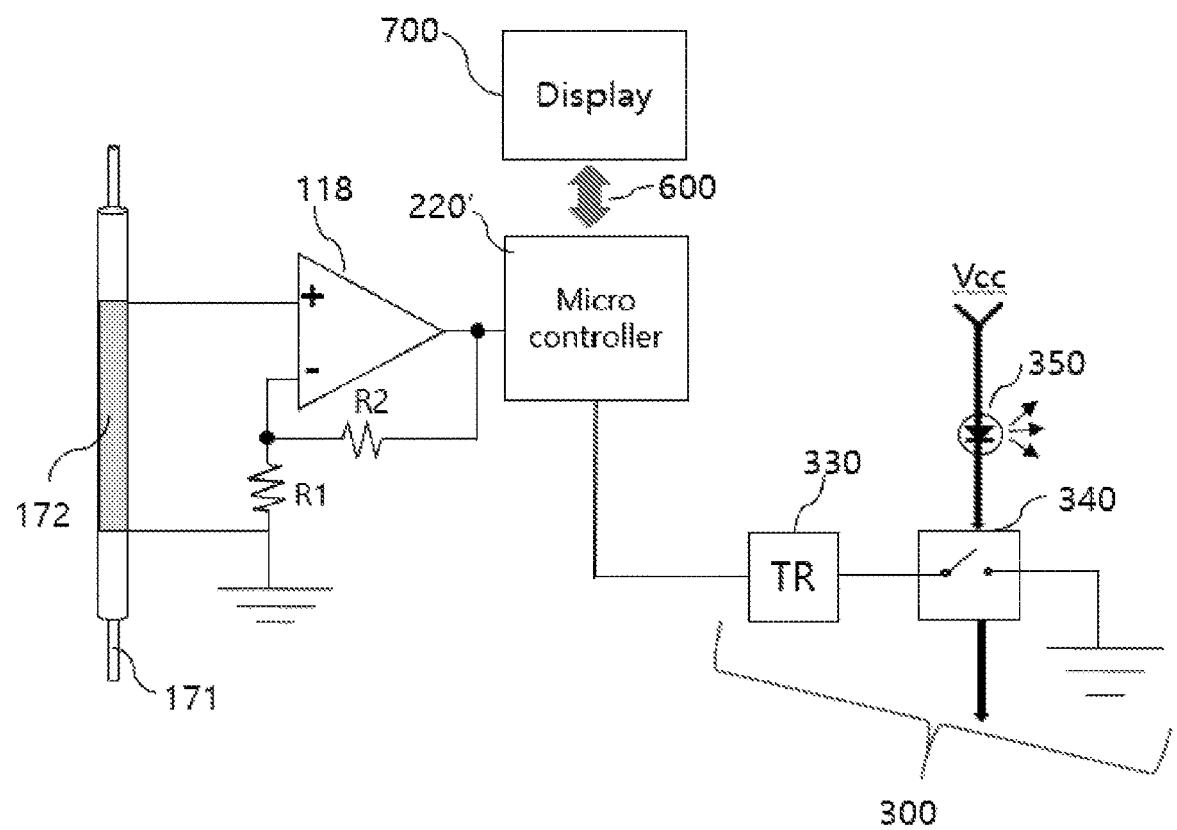
FIG. 22 is a schematic diagram of the breaker of the third embodiment according to the second aspect of the present invention.
Figure 23:
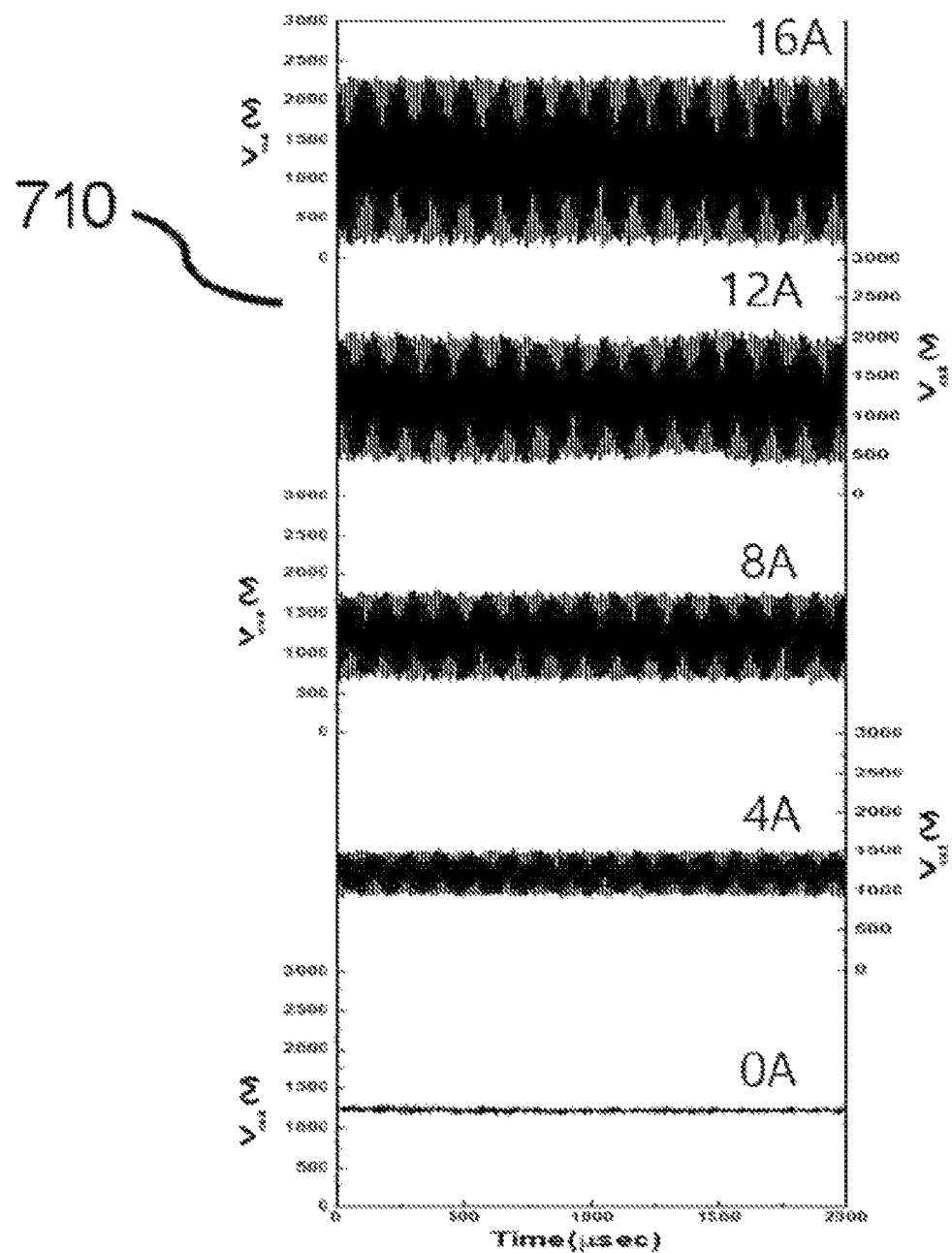
FIG. 23 is the graph obtained from the breaker of the embodiment according to FIG. 22 via communication

FIGS. 18 and 19 are the block diagrams of the first embodiment of the breaker according to the second aspect of the present invention and of a variant example thereof respectively, FIGS. 20 and 21 are the block diagrams of the second embodiment of the breaker according to the second aspect of the present invention and of a variant example thereof respectively, FIG. 22 is the schematic diagram of the third embodiment of the breaker according to the second aspect of the present invention, and FIG. 23 is the graph obtained from the breaker in the embodiment according to FIG. 22.

To briefly describe the proposed breaker according to the second aspect of the present invention, the breaker of the present invention can be organized by arranging a switching part (300, 300') in the micro-controller (200) as a signal processing means (200) connected to the sensor part (100) of the above current sensor, and the above switching part can be produced by combining a control transistor (33) and a relay (340) or by using a power semiconductor switching device (350) instead. The power semiconductor switching device includes IGBT, SCR, TRIAC and power transistor.

Also, in the case the power should be very abruptly cut off, as power cutoff can be delayed due to the time required for operating the software inside the breaker if a micro-controller is used, the power can be cut off by directly organizing an analog circuit using a current sensor, and the breaker of the present invention is technically characterized in that it can be applied to the device that cuts off current such as electronic switch, earth leakage breaker or power breaker.

(Breaker in the First Embodiment)

First, the first embodiment of the breaker according to the second aspect of the present invention is described referring to FIGS. 18 and 19.

First, as shown in FIG. 18, the breaker of the present invention that uses the current sensor to measure alternating electromagnetic wave is characterized in that the output signal of the sensor part (100) of the current sensor is signal processed in the signal processing part (200) and the breaker has a switching means (500) that includes a switching part (300) which compares the detected current with the set value and cuts off the power if the current detected is bigger than the set value.

That is to say, the above switching means (500) is comprised of a signal processing part (200) and a switching part (300), and the above signal processing part (200) belongs to the system that processes the signal detected in the current sensor or amplified, wherein the signal processing part (200) converts the signal detected in the sensor part (100) of the current sensor or amplified by the amplifier (210) into a digital signal via the A/D converter (221), the comparative judgment part (222) compares the converted signal with the set current, and the control signal generating part (223) generates a control signal if the value measured in the comparative judgment part (222) is bigger than the set value.

Also, the switching part (300) is comprised of a control transistor (330) that receives the control signal from the signal processing part (200) and a relay (340) that cuts off the power being operated by the above control transistor (330).

The above micro-controller (220) is comprised of the A/D converter (221), the comparative judgment part (222) and the control signal generating part (223).

Thus, the technical characteristic is that a relay (340) is arranged in the micro-controller (220) connected to the current sensor (100) and cuts off the power.

Also, the signal processing part (200) of the breaker in this embodiment sometimes includes also a communication part (224), in which case the breaker is technically characterized in that it can communicate with external devices through the communication part (224).

In the meantime, as shown in the variant example of FIG. 19, the switching part (300') can be comprised of a power semiconductor switching device (350: refer to FIGS. 19 and 21) that cuts off the power being operated by the signal generated by the signal processing part (200) which includes a micro-controller (220), at which time the power semiconductor switching device (350) is technically characterized in that IGBT, SCR, TRIAC, and power transistor are included.

(Breaker in the Second Embodiment)

In the meantime, to describe the breaker in the second embodiment of the present invention referring to FIGS. 20 and 21, as shown in FIG. 20, the switching means (500) of the breaker in this embodiment is comprised of another signal processing part (250) and a switching part (300).

At this time, the signal processing part (250) of this embodiment has a system which processes the signal detected in the current sensor or amplified by the amplifier through a comparative control part (252) that compares the signal detected in the sensor part (100) of the current sensor or output being amplified by the amplifier with the preset value and generates a control signal if the current detected is bigger than the set value.

Also, the switching part (300) is comprised of a control transistor (330) that receives the control signal from the signal processing part (250) and a relay (340) that cuts off the power being operated by the above control transistor (330) and, in the case the power should be abruptly cut off, the technical characteristic is that the power can be cut off by directly organizing an analog circuit.

Also, the switching part (300') in the variant example can be substituted with a power semiconductor switching device that cuts off the power being operated by the signal generated in the signal processing part (250) which includes the comparative control part (252) and the power semiconductor switching device (350) is characterized in that IGBT, SCR, TRIAC and power transistor are included.

(Breaker in the Third Embodiment)

As the third embodiment which additionally has a communication function, according to a breaker as shown in FIG. 22, a breaker system is shown which has a communication function as in FIGS. 17 and 19.

First, a measurement wire (172) is formed by wrapping a copper film of about 10 mm size around a power wire (172) covered with an insulating material and a current sensor is made by connecting it to an amplifier (118). The output signal of the amplifier is connected to the A/D input part of a 32 bit micro-controller (220') of ST Micro.

A set value of 15 A is predetermined and a program is created to generate a control signal using the 2N3904 NPN transistor (330) if the value detected is bigger than the set value and uploaded the program inside the micro-controller (220').

A general commercial DC relay (340) is made to be controlled by generating the power of the transistor (330) using the output signal from the micro-controller (220'). An LED (350) is attached to check out the operation of the relay when it operates. Also, the micro-controller is made to communicate (600) with a PC (700) via the communication port inside the micro-controller.

As an experiment example shown in FIG. 23, an alternating current load is applied to the power wire increasing it by 2 A step by step. As a result, PC communication is achieved and the data in FIG. 23 is obtained from the PC (700).

In addition, it is confirmed that the LED is turned on when the relay operates at the current set for control (15 A, for example). The present invention is determined to be a feasible technology by confirming that a series of operation is well carried out by turns.

In addition, if the measurement wire (172) is formed with a thin film such as copper film as in this embodiment, the three-dimensional size may be ignored and the measurement wire has an additional advantage that it can be also applied to nano technology. The above copper film in this embodiment may completely cover the power wire or cover only a part of it (for example, 90~270°)

(Example of Experiment on Cancelling of High Frequency Noise)

Figure 24:
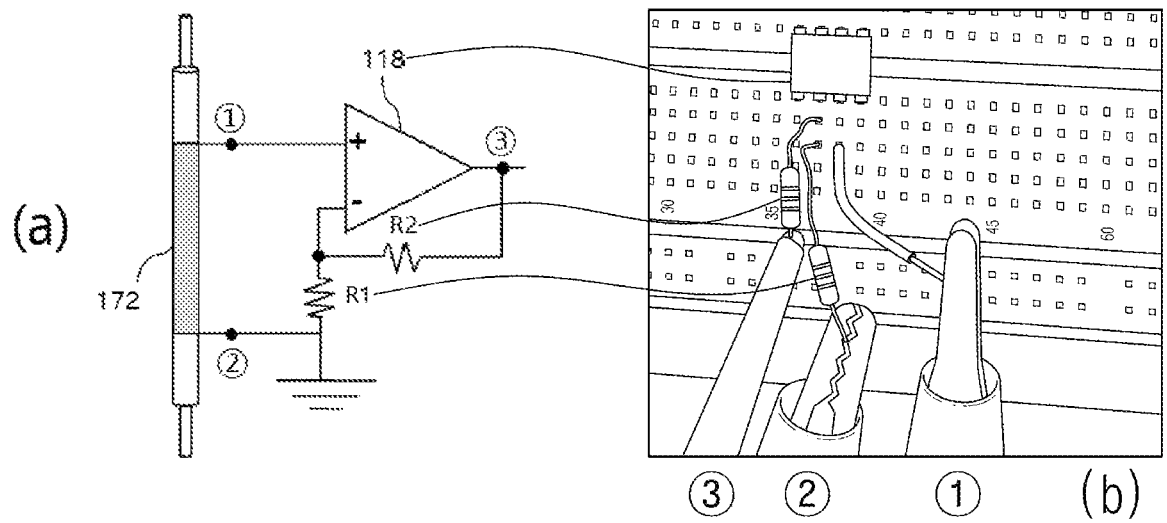
FIG. 24 is the photo of the experimental equipment for comparative experiment of the current sensor according to the embodiment of FIG. 3 depending on whether the current sensor has a bead or not.
Figure 24:
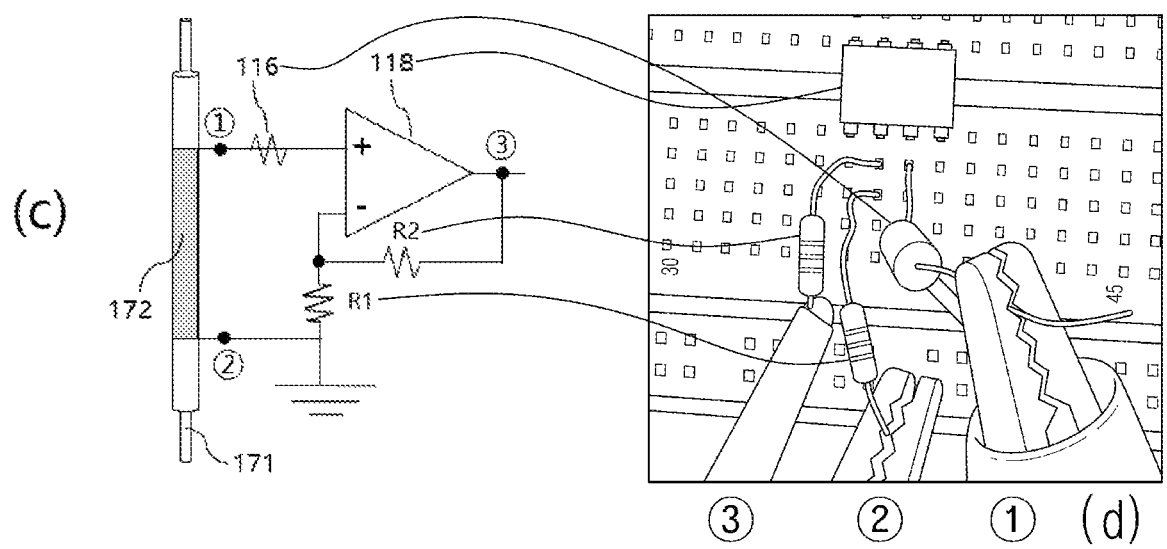

In the meantime, FIG. 24 is a photo of the experimental device used for a comparative experiment to check to what extent the impact of external electromagnetic wave (high frequency noise, in particular) is cancelled depending on whether there is a high frequency noise filter bead (116) or not, in the case of the current sensor in a variant example of the first embodiment (refer to FIG. 3), and FIGS. 24(a) and (b) show the circuit and experimental state of the case where no bead is inserted and FIGS. 24(c) and (d) show the circuit and experimental state of the case where a bead is inserted.

Figure 25:
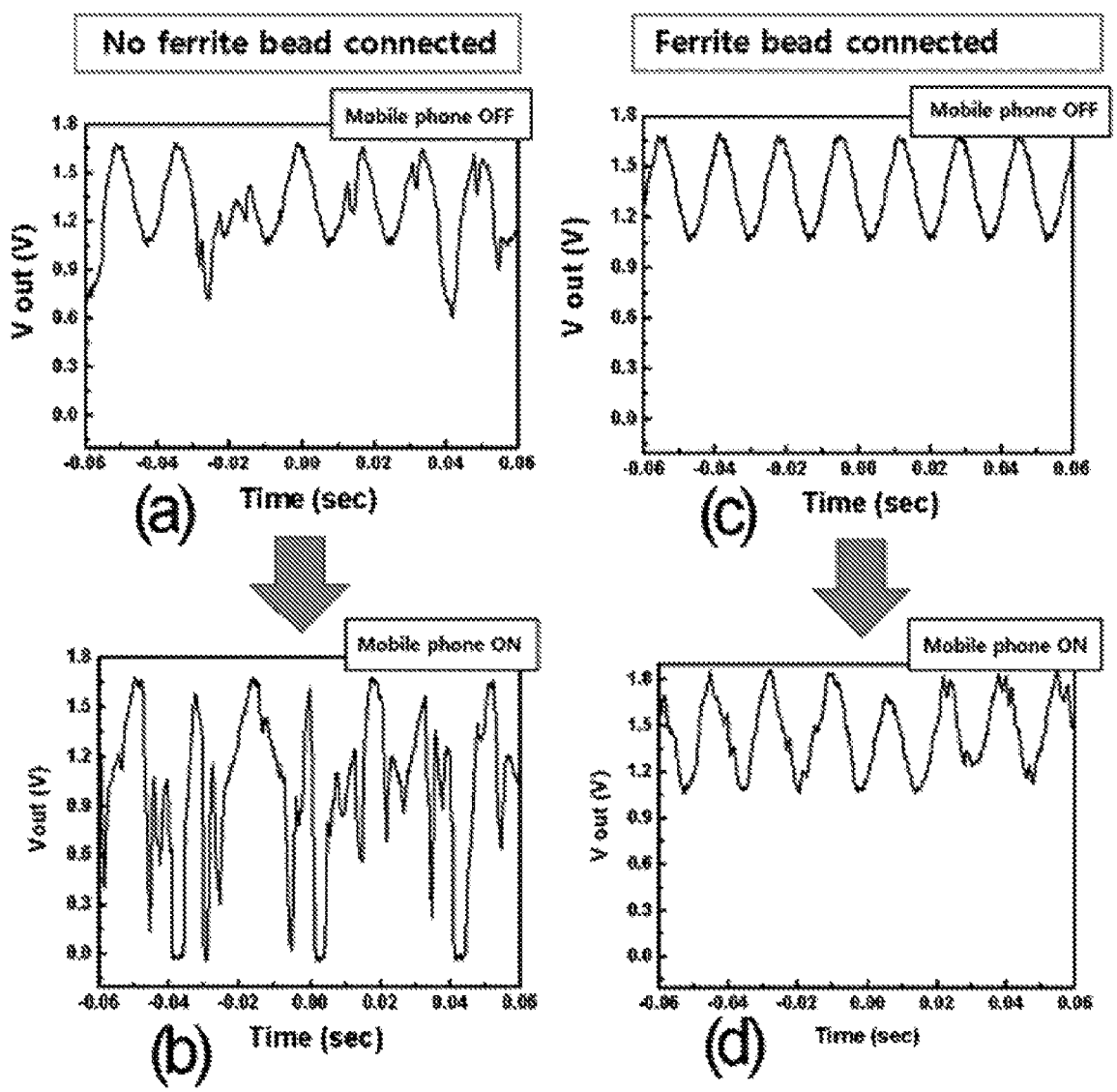
FIG. 25 is the graph of the experiment result measured by the experimental equipment of FIG. 24.

FIG. 25 is the graph of the experimental result measured by the experimental device of FIG. 24, and (a) and (b) of FIG. 25 show the experimental result graph of the case where no bead is inserted and (c) and (d) of FIG. 25 show the experimental result graph of the case where a bead is inserted.

In this experiment, as shown in FIGS. 24(a) and 24(c), in the sensor part (172) for the current sensor, the measurement wire (172) is formed by wrapping copper film about 30 mm long and 2 mm wide over the power wire (171) coated with an insulating material and is connected to the amplifier (118) which has the first and second resistors (R1, R2) as peripheral circuits to form a current sensor, and the terminal (①) at one side of the above measurement wire (172) is connected to the non-inverting terminal (+) of the amplifier (118) and FIGS. 24(b) and 24(d) show that it is fixed by a red connection clip. For reference, HIV IV wire 4SQ is used as the sensor wire and LM2904N chip is used as the amplifier.

In the meantime, as shown in FIGS. 24(a) and 24(c), the terminal (②) at the other side of the above measurement wire (172) is connected to the inverting terminal (−) of the amplifier (118) via the first resistor (R1), and FIGS. 24(b) and 24(d) show that it is fixed by a black connection clip.

However, as shown in FIGS. 24(a) and 24(b), though the above terminal (①) at one side is directly connected to the non-inverting terminal (+) of the above amplifier in the experiment example where no ferrite bead is used, as shown in FIGS. 24(c) and 24(d), it can be seen that the above terminal (①) at one side is connected to the non-inverting terminal (+) of the above amplifier via the ferrite bead (116) in the experiment example where a ferrite bead is used.

Lastly, the output terminal (③) of the above amplifier is connected to the second resistor (R2) and, at the same time, to the oscilloscope (not attempted) that measures the current waveform to display the final output waveform so that the change in the waveform can be observed.

Now, with the alternating current power of 8 A, 10 V applied to the power wire (171), the waveform amplification and change have been observed while talking on the phone holding the smartphone close to the sensor at a distance of about 20 to 30 cm.

First, i) FIGS. 24(a) and (b) are the cases where no ferrite bead is used and, while the sinusoidal waveform is maintained well enough though with a little change when the smartphone is in an 'OFF' state as shown in FIG. 25(a), ii) the waveform is completely distorted to the extent it is not identifiable due to external high frequency noise when the smartphone is in an 'ON' state as shown in FIG. 25(b).

On the other hand, iii) in the case of FIGS. 24(c) and (d) wherein a ferrite bead is used as a high frequency noise filter, an intact sinusoidal waveform is output as shown in FIGS. 25(c) and (d) irrespective of whether the smartphone is in an 'ON' or 'OFF' state. In particular, when the smartphone is in an 'OFF' state, almost perfect sinusoidal waveform is output as shown in FIG. 25(c) and, even when the smartphone is in an 'ON' state, it can be seen that a sinusoidal waveform sufficiently measurable is output as shown in Drawing 25(d).

That is to say, accordingly to the above experiment example, if a ferrite bead is used as a high frequency noise filter, it can be seen that the current sensor of the present invention successfully performs current sensing with no malfunction irrespective of external noise (even when the current sensor of the present invention is in operation while talking on the smartphone).

Figure 26:
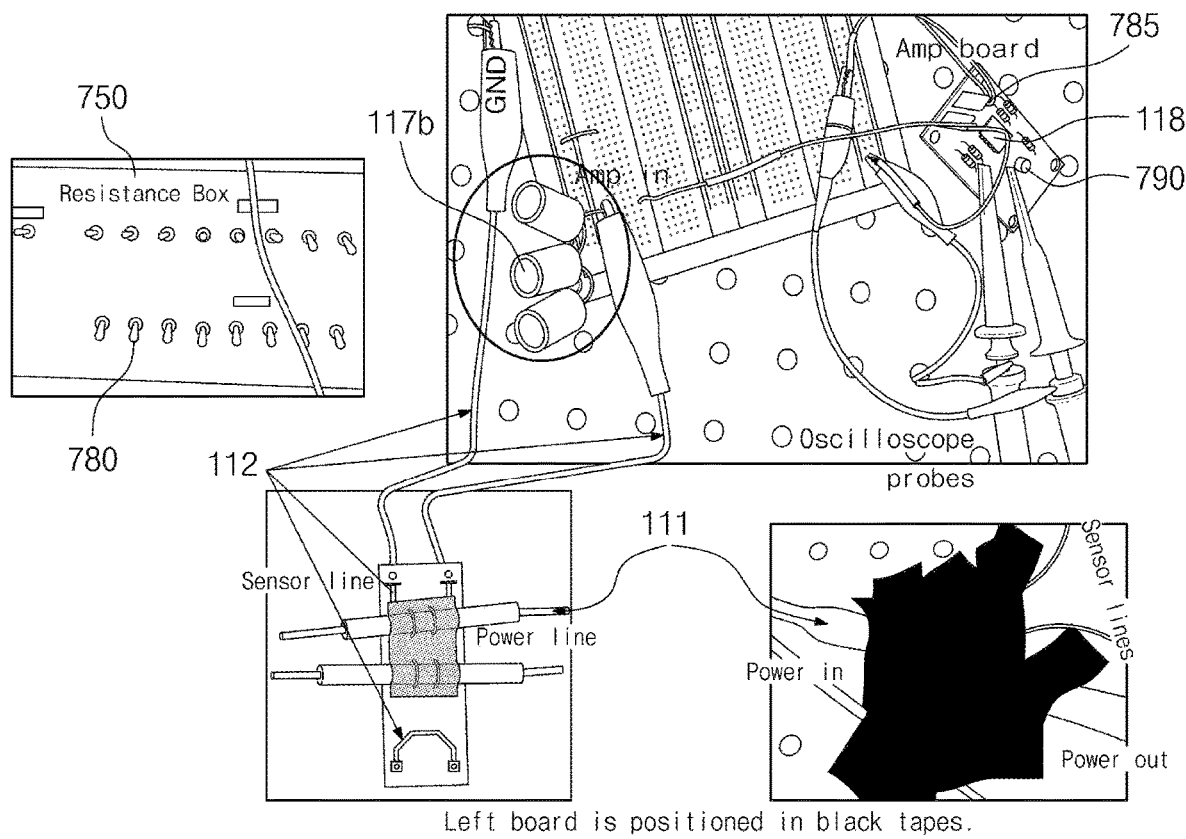
FIG. 26 is the layout for the experiment for generation and removal of chattering noise signals that flow in through the power conducting line.
Figure 27:
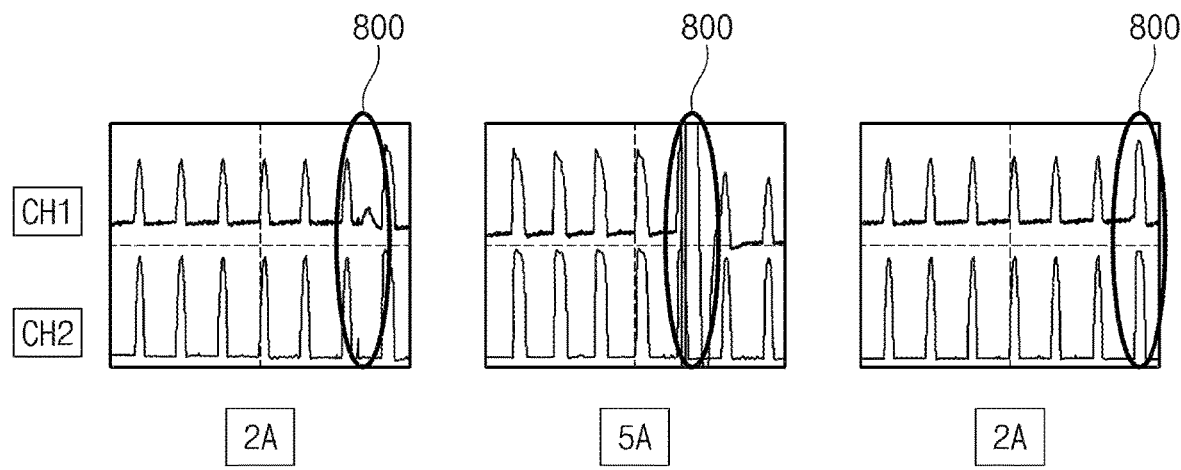
FIG. 27 illustrates the chattering signal observed during the experiment in accordance with FIG. 26.
Figure 28:
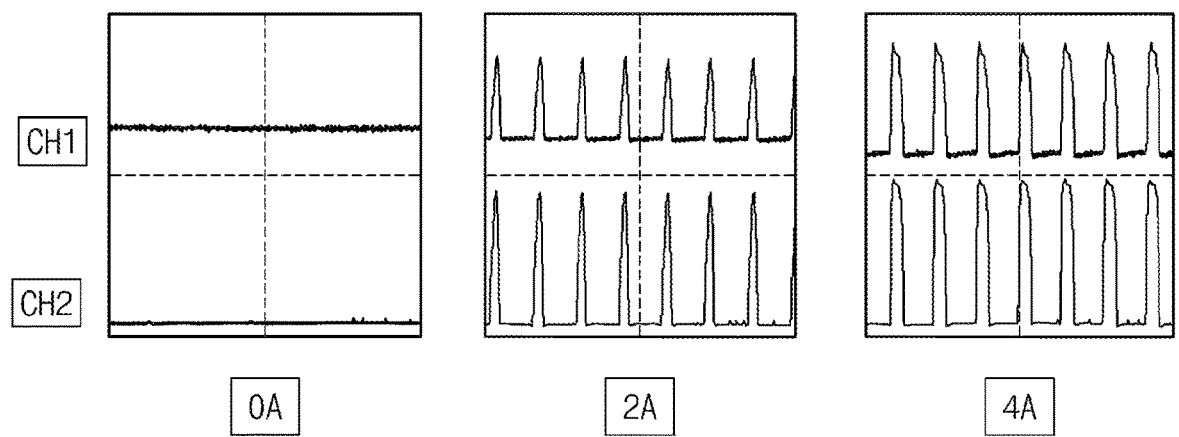
FIG. 28 illustrates the effects of a capacitor for removal of the chattering noise in the experiment in accordance with FIG. 26.

An execution example of the invention for removal of a chattering noise signal entering through the current sensor are illustrated by FIGS. 26-28. The chattering noise signal is generated by the operation of the power conversion switch of the power conduction line. First, the AC power conduction line (111) is connected to the resistance box (750) to control the AC power (FIG. 26). Allow the AC current to flow to the power conduction line in the sensor board along with the sensor conduction line (112) (FIG. 26). Then, connect the sensor conduction line output signal to the amplifier (118) circuitry in the PCB circuit board (785) (FIG. 26). Connect the sensor signal detected by the sensor conduction line to the oscilloscope channel (CH 1) through the amplifier (118) before connecting the amplified signal to the base-emitter of transistor (790) capable of operating the relay for short-circuiting of power. Here, the base signal of the transistor is connected to the oscilloscope channel (CH 2). If there is no capacitor (117b), which is a filter for the removal of the chattering noise, the chattering noise signal (800) generated by repetitively turning On and Off the chattering generation switch (780) (FIG. 26) is detected by the channels (CH 1 and CH 2) (FIG. 27). If there is a 66 µF capacitor (117b), which is a filter for the removal of the chattering noise, the chattering signal is not detected, even if the chattering noise signal (800) is generated by repetitively turning On and Off the chattering generation switch (780) (FIG. 26). The oscilloscope will illustrate periodically vibrating amplified sensor signals and control signals (FIG. 28).

Though the present invention is described by a limited number of embodiments and drawings as above, the present invention is not limited to the above embodiments. The present invention can be applied to current sensors and breakers through diverse variants by persons of ordinary knowledge in this field, and the category of the technology that technically facilitates creation of variants should be admitted to come under the scope of the present patent right.

DESCRIPTION OF SIGNS

100: Sensor part for current sensor
11: Power wire terminal
12: Measurement wire terminal
21: Power wire terminal
22: Measurement wire terminal
110: Sensor part for single-curve type current sensor
111: Power wire (or Power conductor line)
112: Measurement wire (or Measurement conductor line)
113: Curved pattern
114: PCB substrate
115: Insulating material
116: High frequency noise filter bead
117a: Capacitor
117b: Capacitor
118: Operational amplifier
120: Sensor part for dual-curve type current sensor
121: Power wire
122: Measurement wire 123: Curved pattern
130: Sensor part for current sensor
131': Power wire coated with an insulating material
132: Measurement wire
135: Combined substrate of power wire and measurement wire
136: Shield film
140: Sensor part for current sensor
141: Power wire coated with an insulating material
142: Measurement wire
144: Conductive tube for measurement
150: Micro-sensor part for current sensor
150a: Polyimide substrate
152: Micro-sensor pattern
152a: Electrode pad
153: Via
180: Oscilloscope image
160: Sensor part for current sensor
161: Power wire of which the cover is peeled off
162: Sensing area
162a, 162b: Terminal for measurement of electromagnetic wave
118: Operational amplifier
200: Signal processing part
210: Amplifier
220: Micro-controller
221: A/D (Analog-Digital) converter
222: Comparative judgment part
223: Control signal generating part
224: Communication part
300, 300': Switching part
330: Control transistor
340: Relay
350: Power semiconductor switching device
500: Switching means
250: Signal processing part
251: Amplifier
252: Comparative control part
300, 300': Switching part
330: Control transistor
340: Relay
350: Power semiconductor switching device
500: Switching means
171: Power wire
172: Measurement wire (one made by wrapping the power wire with copper film and it corresponds to copper pipe)
118: Amplifier
220': 32 bit micro-controller of ST Micro
330: Transistor for relay control (2N3906)
340: General relay for 1 A
350: LED for relay test checking
600: Communication network between micro-controller and external computer
700: External computer
710: Experiment data obtained from external computer (600)
750: Resistance box
780: Power conversion switch for the generation of chattering noise signal
785: Circuit board that includes the circuitry in FIG. 3 and the transistor for generation of control signal
790: Transistor for generation of the control signal
800: Chattering noise signal

The invention claimed is:

1. A current sensor for alternating current which measures the alternating current in the power wire of which the purpose is to supply alternating current power to an electric device and which has a voltage difference at both ends of the above first input/output terminal and the second input/output terminal to enable alternating current to flow between the first input/output terminal and the second input/output terminal, that includes:

a sensor part which includes a non-coil type measurement wire arranged in parallel with the power wire located between the above first input/output terminal and the second input/output terminal, being separated by a certain distance with an electrical insulating material; and a means of detecting alternating current by measuring the electromotive force induced across the above measurement wire from the magnetic field generated by the current flowing through the power wire located between the above first input/output terminal and the second input/output terminal; and what is characterized in that the means of detecting the above alternating current includes an amplifier.

2. A current sensor of claim 1 characterized in that a ferrite bead high frequency filter for removal of high frequency noise that flows in through the measurement wire is connected to the front end of the above amplifier.

3. A current sensor of claim 1 characterized by a capacitor filter connected to the front end of the aforementioned amplifier for removal of high frequency chattering noise that flows in through the measurement conduction wire.

4. A current sensor of claim 1 characterized in that the above measurement wire is comprised of either a piece of one-dimensional wire, two-dimensional plane or three-dimensional tube.

5. A current sensor of claim 1 characterized in that the power wire and the measurement wire have a curved pattern; the above curved pattern gathers magnetic field; and the lengths of the above power wire and measurement wire can be adjusted using the above curved pattern.

6. A current sensor of claim 1 characterized in that a shield film that cuts off the electromagnetic wave generated across the power wire that goes outside and the electromagnetic wave coming in from outside is additionally included.

7. A current sensor of claim 1 characterized in that the above sensor part is arranged on a polyimide substrate (150a) in a micro-sensor pattern (152); and it organizes a flexible printed circuit board to have flexibility.

8. A current-sensor system using a current sensor of claim 1 characterized in that a micro-controller (220) connected to the above amplifier is additionally included; and the above micro-controller (220) is comprised of an A/D converter (221) which changes an output signal of the above current sensor (100) to a digital signal, a comparative judgment part (222) which judges the digital signal from the above A/D converter (221) by comparing it with a set current, and a control signal generating part (223) which generates a control signal if the value measured is bigger than the set current.

9. A current-sensor system of claim 8 characterized in that a communication part (224) is additionally included and the current sensor can communicate with external devices via the above communication part.

10. A current-sensor system using a current sensor of claim 1 characterized in that the above means of detecting alternating current is substituted with a micro-controller (220) not connected to the above amplifier (210) and the above micro-controller (220) directly connected to the above sensor part (100) is comprised of a high precision A/D converter (221) with a resolution of over 16 bits which changes an output signal of the above sensor part (100) to a digital signal being directly connected to the above sensor part (100), a comparative judgment part (222) which judges the digital signal from the above A/D converter (221) by comparing it with the a current, and a control signal generating part (223) which generates a control signal if the value measured is bigger than the set current.

11. A current-sensor system of claim 10 characterized in that a communication part (224) is additionally included and the current sensor can communicate with external devices via the communication part (224).

12. A current sensor for alternating current which measures the alternating current in the power wire of which the purpose is to supply alternating current power to an electric device and which has a voltage difference at both ends of the above first input/output terminal and the second input/output terminal to enable alternating current to flow between the first input/output terminal and the second input/output terminal, that includes:

a sensor part which includes a non-coil type measurement wire arranged in parallel with the power wire located between the above first input/output terminal and the second input/output terminal, being electrically in contact with it with no separation distance; and a means of detecting alternating current by measuring the electromotive force induced across the above measurement wire from the magnetic field generated by the current flowing through the power wire located between the above first input/output terminal and the second input/output terminal; and what is characterized in that the means of detecting the above alternating current includes an amplifier.

\* \* \* \* \*